(12) United States Patent
Otsuka et al.

(10) Patent No.: US 7,009,216 B2
(45) Date of Patent: Mar. 7, 2006

(54) SEMICONDUCTOR LIGHT EMITTING DEVICE AND METHOD OF FABRICATING THE SAME

(75) Inventors: Nobuyuki Otsuka, Kawanishi (JP); Shigeo Yoshii, Hirakata (JP); Toshiya Yokogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 135 days.

(21) Appl. No.: 10/718,581

(22) Filed: Nov. 24, 2003

(65) Prior Publication Data

US 2004/0135155 A1    Jul. 15, 2004

Related U.S. Application Data

(63) Continuation of application No. PCT/JP03/01285, filed on Feb. 7, 2003.

(30) Foreign Application Priority Data

Feb. 8, 2002    (JP)    ............................. 2002-032073

(51) Int. Cl.
    *H01L 33/00*    (2006.01)
    *H01S 3/19*    (2006.01)
(52) U.S. Cl. ............................ 257/98; 257/13; 438/47; 372/102; 372/50.11
(58) Field of Classification Search ................. 257/13, 257/97, 98; 372/99, 102, 45; 438/47
See application file for complete search history.

(56) References Cited

U.S. PATENT DOCUMENTS 6,674,778 B1 *    1/2004    Lin et al. ...................... 372/46
6,728,457 B1 *    4/2004    Sigalas et al. .............. 385/125

FOREIGN PATENT DOCUMENTS

| JP | 63-111689 | 5/1988 |
|----|-----------|--------|
| JP | 63-177494 | 7/1988 |
| JP | 01-105590 | 4/1989 |
| JP | P2000-162459 | 6/2000 |
| JP | P2000-332353 | 11/2000 |
| JP | P2001-308452 | 11/2001 |
| JP | P2001-308457 | 11/2001 |

OTHER PUBLICATIONS

Labilloy et al IEEE J. Quantum Elec. vol. 35 No. 7 Jul. 1999 pp. 1045-1052□□"Diffraction Efficiency . . . Lattices".*

(Continued)

*Primary Examiner*—Jerome Jackson
(74) *Attorney, Agent, or Firm*—McDermott Will & Emery LLP

(57) ABSTRACT

A semiconductor light emitting device of the present invention comprises a n-type InP substrate (1), and a stripe structure (10) formed in the stripe shape on the n-type InP substrate (1) and comprised of a n-type InP lower cladding layer (3), an active layer (4) having a resonator in a direction parallel to the n-type InP substrate (1), and a p-type InP upper cladding layer (5). The stripe structure (10) has a photonic crystal structure (2) with concave portions 9 arranged in rectangular lattice shape, and the direction in which the concave portions (9) of the photonic crystal structure (2) are arranged corresponds with a resonator direction. A stripe-shaped upper electrode (6) is formed on the stripe structure (10) to extend in the resonator direction. The semiconductor light emitting device of the present invention so structured is configured to radiate light in the direction perpendicular to the n-type InP substrate (1).

23 Claims, 21 Drawing Sheets

OTHER PUBLICATIONS

Toshihiko Baba, "Photonic Kessho Hakko Sosi No Genjo", Optronics, No. 235 (2001), pp. 192-196.

J. Moosburger, et al., "Nanofabrication Techniques for Lasers with Two-Dimensional Photonic Crystal Mirrors", Journal of Vacuum Science and Technology B, vol. 18, No. 6, pp. 3501-3504 (2000).

O. Painter et al., Two-Dimensional Photonic Band-Gap Defect Mode Laser, Science, Jun. 11, 1999, vol. 284, pp. 1819-1821.

Thomas D. Happ, et al., Single-Mode Operation of Coupled-Cavity Lasers Based on Two-Dimensional Photonic Crystals, Applied Physics Letters, vol. 79, No. 25, pp. 4091-4093.

* cited by examiner

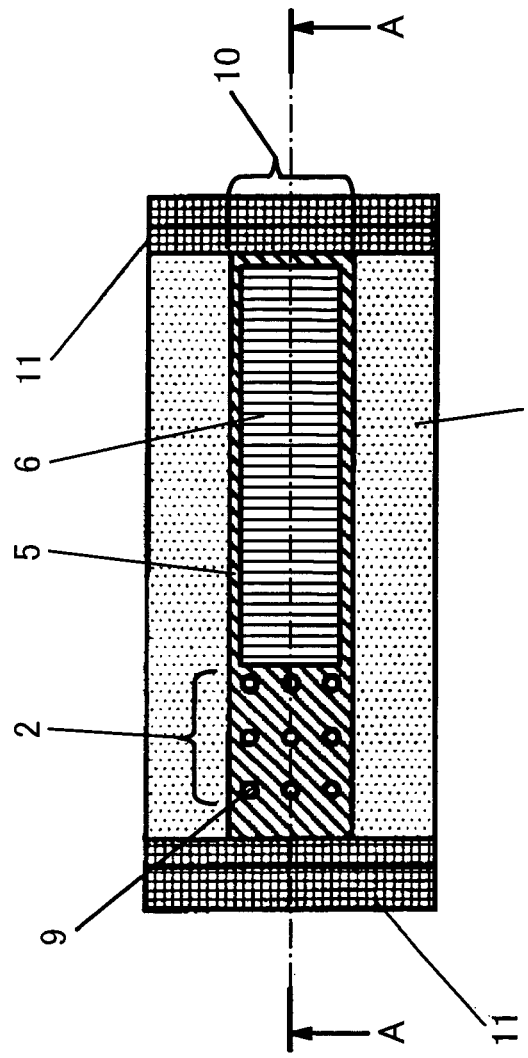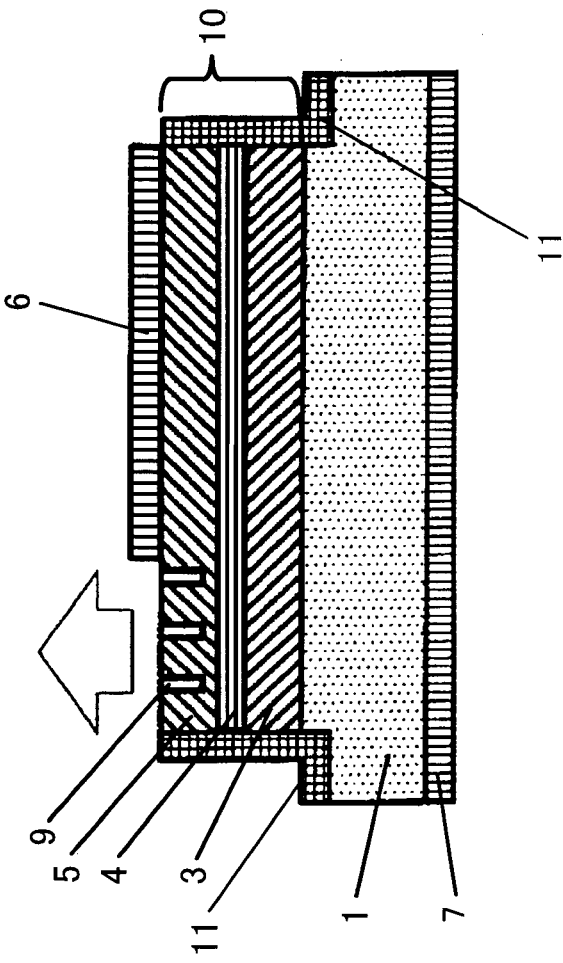
FIG. 11A
FIG. 11B

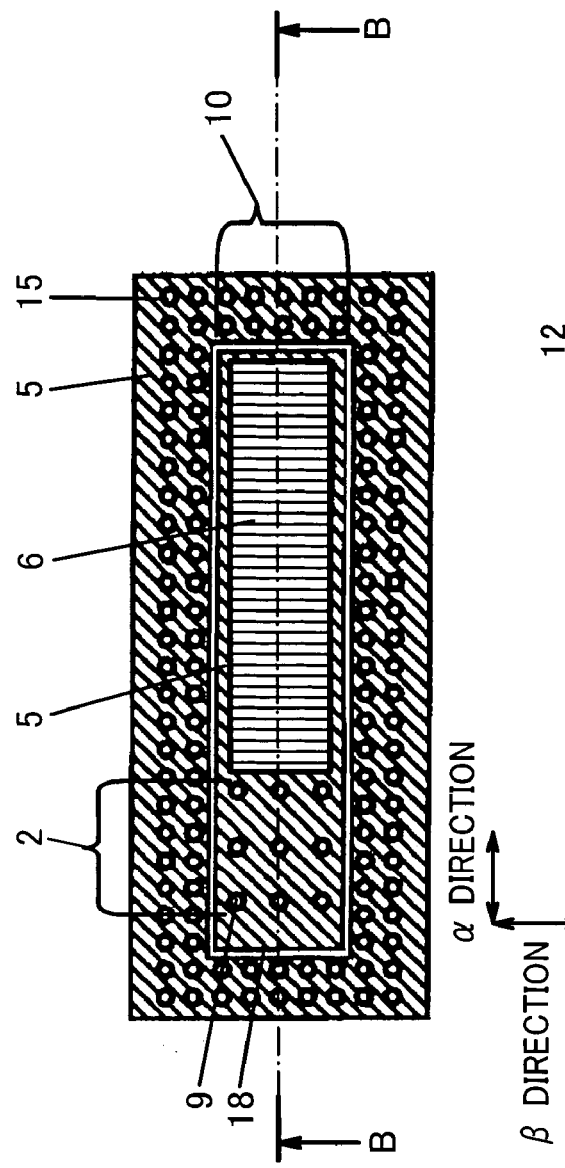
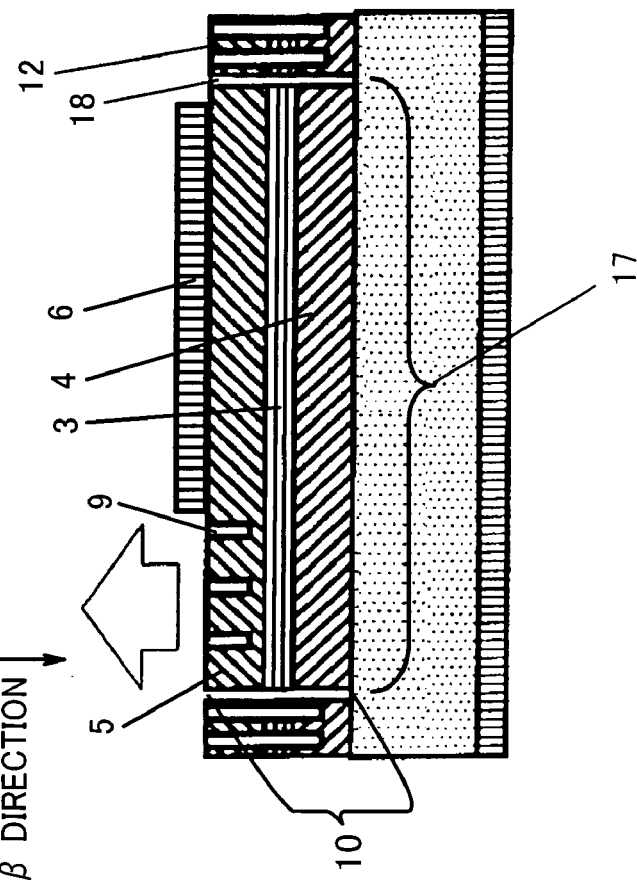
FIG. 12A
FIG. 12B

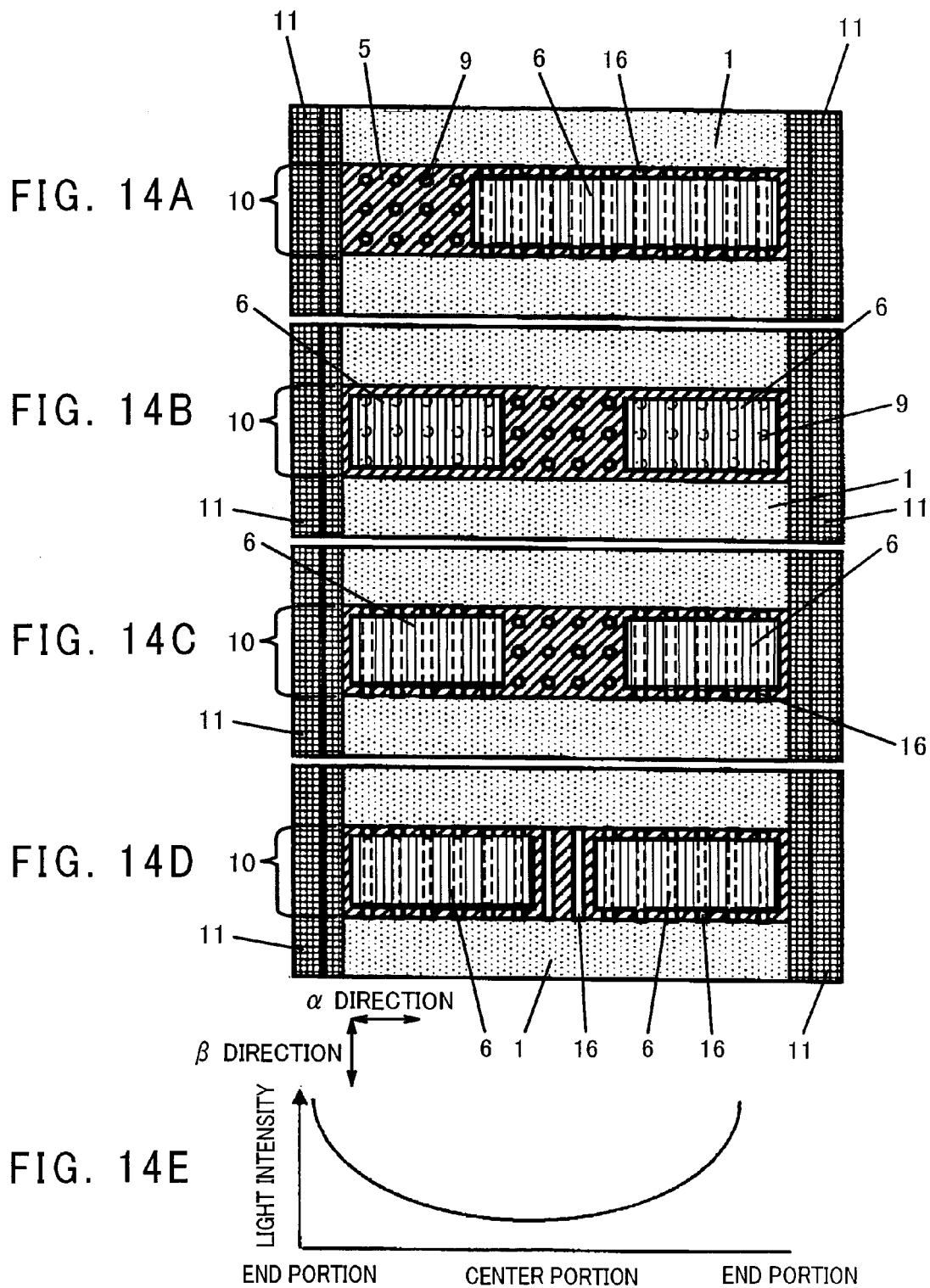

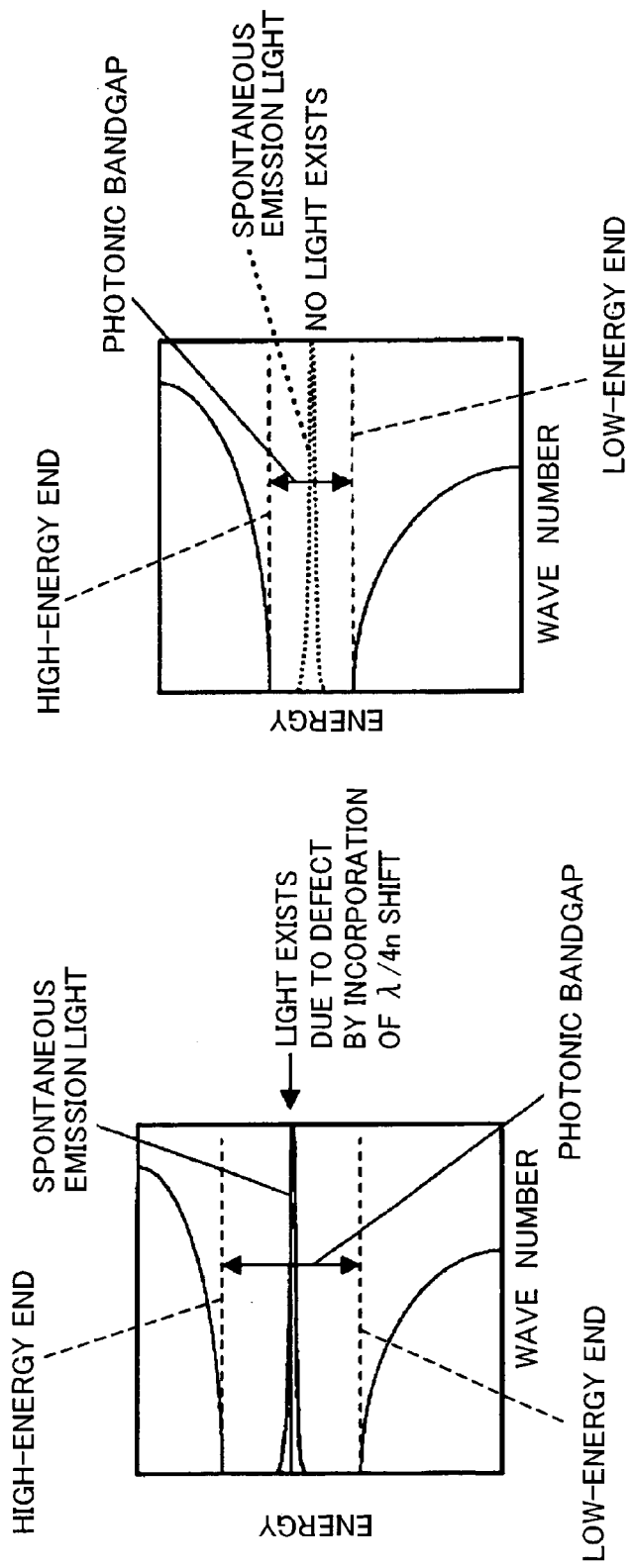

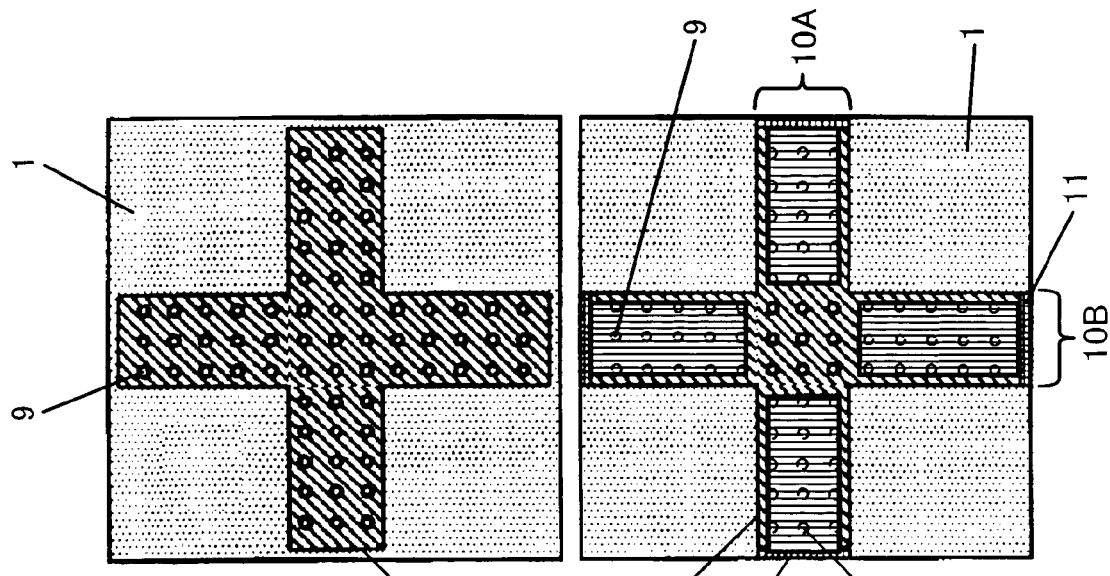
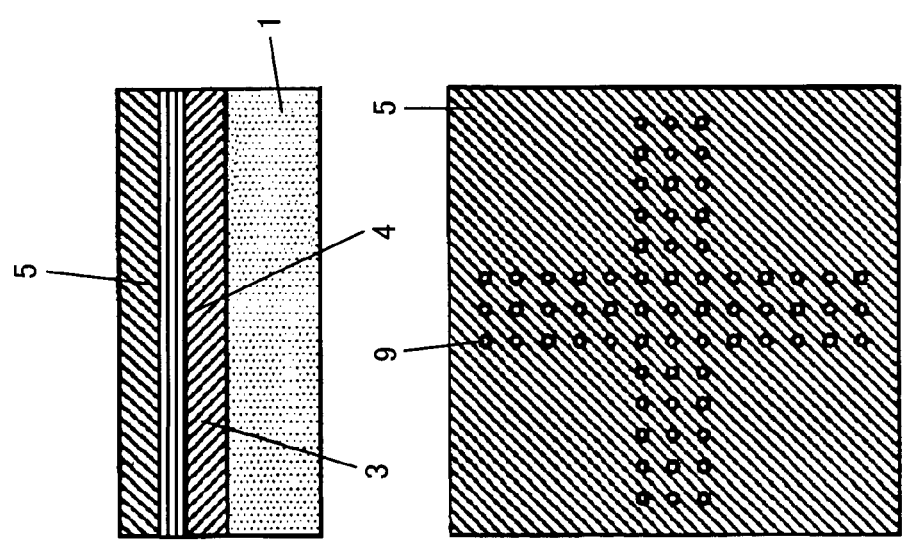
FIG. 19A
FIG. 19B
FIG. 19C
FIG. 19D

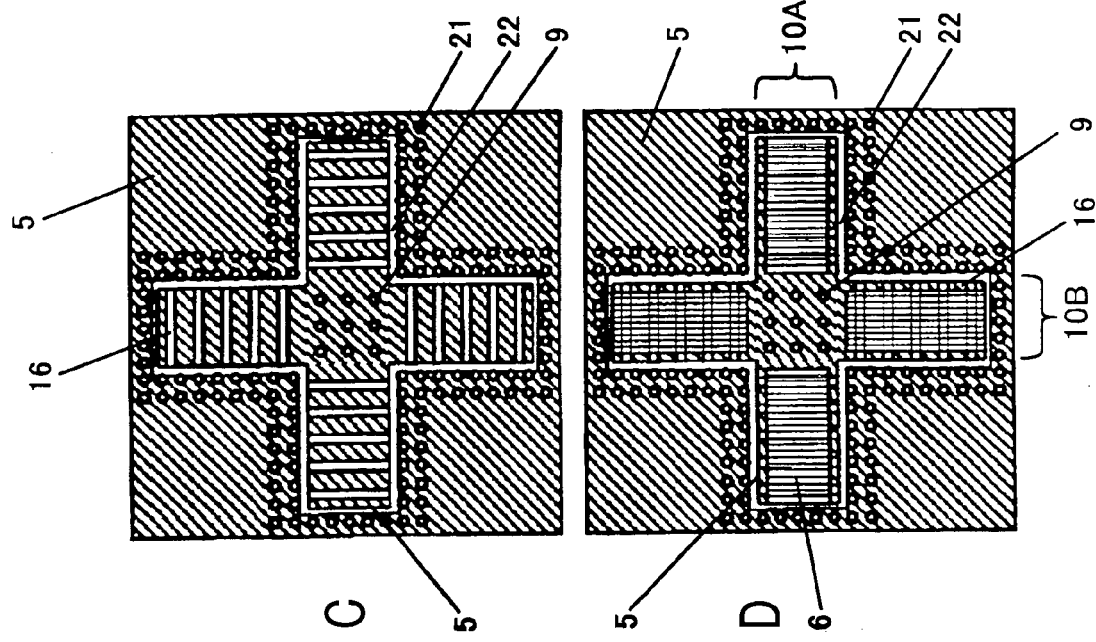
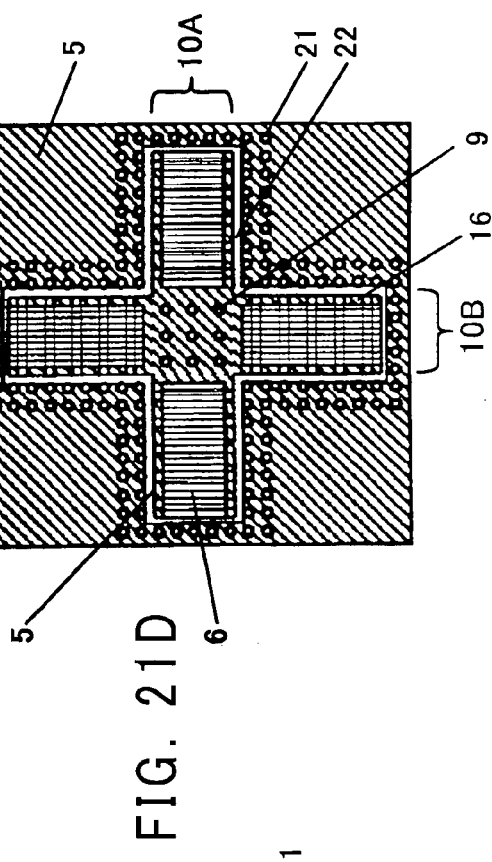
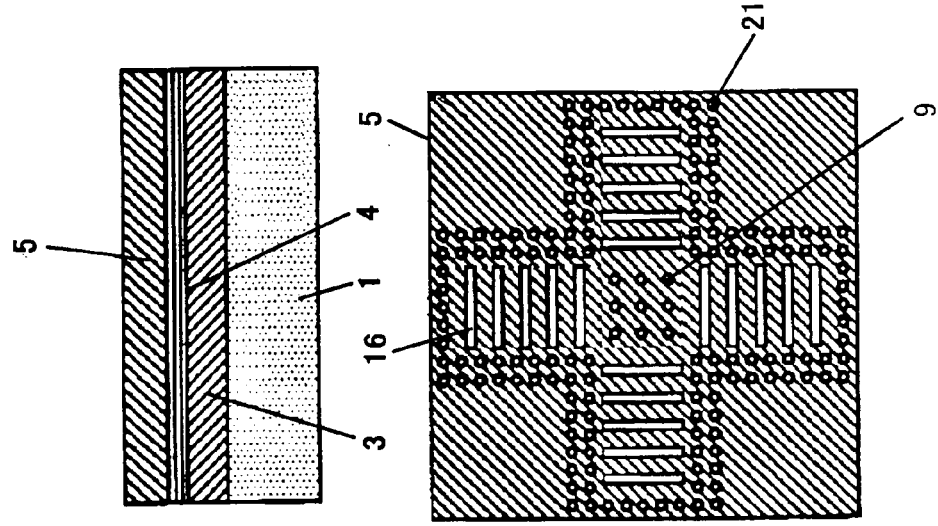
FIG. 21A  FIG. 21B  FIG. 21C  FIG. 21D

SEMICONDUCTOR LIGHT EMITTING DEVICE AND METHOD OF FABRICATING THE SAME

This is a continuation application under 35 U.S.C.111(a) of pending prior International Application No. PCT/JP03/01285, filed on Feb. 7, 2003.

BACKGROUND OF THE INVENTION

1. Field of the Invention

The present relates to a semiconductor light emitting device of a surface emitting type using photonic crystal grown on a substrate and a method of fabricating the same.

2. Description of the Related Art

The conventional semiconductor light emitting devices using photonic crystal are disclosed in, for example, Japanese Laid-Open Patent Application Publication No. Hei. 11-330619, Japanese Laid-Open Patent Application Publication No. 2001-308457, Japanese Laid-Open Patent Application Publication No. 2001-9800 (U.S. patent Publication No. 2002/0109134 specification), Japanese Laid-Open Patent Application Publication No. Sho 63-205984 (U.S. Pat. No. 4,847,844 specification), and Japanese Laid-Open Patent Application Publication No. 2002-062554.

Likewise, the semiconductor light emitting device is also disclosed in "Imada et al., Applied Physics Letters 75 (1999) 316 (Appl. Phys. Lett. 75 (1999) 316)." FIG. 1 is a perspective view showing a structure of the conventional semiconductor light emitting device using photonic crystal disclosed in this "Imada et al." As shown in FIG. 1, on a n-type InP substrate 51, a n-type InP photonic crystal layer 52, a n-type InP lower cladding layer 53, a quantum well active layer 54 comprised of InGaAsP, and a p-type InP upper cladding layer 55 are sequentially disposed. On a rear surface of the n-type InP substrate 51, a lower electrode 57 is formed, and on a front surface of a p-type InP upper cladding layer 55, a circular upper electrode 56 having a diameter of approximately 350 $\mu$m is formed. Further, on a n-type InP photonic crystal layer 52, a plurality of circular concave portions 59 each having a diameter of 0.2 $\mu$m are periodically formed.

The n-type InP photonic crystal layer 52 is grown on the n-type InP substrate 51 to have the plurality of concave portions 59, while the p-type InP upper cladding layer 55, the quantum well active layer 54, and the n-type InP lower cladding layer 53 are grown in this order on another substrate. Then, the n-type InP lower cladding layer 53 is brought into surface contact with the n-type InP photonic crystal layer 52, and they are annealed in hydrogen atmosphere to be fusion bonded to each other (see arrow 60). Thereafter, the substrate is removed from the substrate and the p-type InP upper cladding layer 55 grown thereon, the circular upper electrode 56 is formed on a surface thereof, and the lower electrode 57 is formed on the rear surface the n-type InP substrate 51, thereby fabricating a semiconductor light emitting device structured as described above.

Upon conducting a current between the upper electrode 56 and the lower electrode 57 in the semiconductor light emitting device fabricated as described above, at a threshold current of 2A or more, stimulated emission is observed and a single mode with an oscillation wavelength of 1.3 $\mu$m is gained. Light emits from an outer peripheral portion 58 of the upper electrode 56.

As should be understood, in the conventional semiconductor light emitting device, the threshold current is relatively large, for example, 2A.

In addition, since the upper electrode 56 is circular, polarization planes of light have different directions. The polarization planes may be oriented in the same direction by forming the concave portions 59 in the shape of oval, but the plurality of concave portions 59 which have the same oval shape are very difficult to create.

Even in the light having the same polarization plane, the light emitting wavelength becomes unstable because of the presence of two stable light emitting modes.

Although the semiconductor light emitting device is fabricated by fusion bonding crystals to each other as described above, the entire surfaces of the substrates having a large diameter are difficult to fusion bond.

SUMMARY OF THE INVENTION

The present invention has been developed under the circumstances, and an object of the present invention is to provide a semiconductor light emitting device with a low threshold current and with polarization planes of light controlled, and a method of fabricating the semiconductor light emitting device.

In order to achieve the above described object, there is provided a semiconductor light emitting device comprising a semiconductor substrate; a semiconductor layered structure provided on the semiconductor substrate and comprised of a lower cladding layer, an active layer having a resonator in a direction parallel to the semiconductor substrate, and an upper cladding layer; an upper electrode connected to the upper cladding layer and extending in stripe shape in a resonator direction; and a lower electrode connected to the lower cladding layer, wherein the semiconductor layered structure has a photonic crystal structure in which a plurality of concave portions or convex portions are arranged periodically in the resonator direction, the photonic crystal structure is configured such that at least part of the photonic crystal structure does not overlap with the upper electrode and the photonic crystal structure and the upper electrode are arranged in the resonator direction as seen in a plan view, and when a predetermined voltage is applied between the upper electrode and the lower electrode, light radiates from a region of the photonic crystal structure which does not overlap with the upper electrode as seen in a plan view.

It is preferable that in the semiconductor light emitting device, the concave portions or the convex portions are formed in the upper cladding layer.

It is preferable in that in the semiconductor light emitting device, the concave portions or the convex portions are formed in the upper cladding layer, the active layer, and the lower cladding layer.

It is preferable that in the semiconductor light emitting device, the concave portions or the convex portions are cylindrical.

It is preferable that in the semiconductor light emitting device, the concave portions or the convex portions are flat-plate shaped.

It is preferable that in the semiconductor light emitting device, the resonator has a width of not less than 2 $\mu$m and not more than 10 $\mu$m.

It is preferable that in the semiconductor light emitting device, wherein the resonator has a length of not less than 20 $\mu$m and not more than 50 $\mu$m.

It is preferable that in the semiconductor light emitting device, the resonator direction is <110> direction or <−110> direction.

It is preferable that in the semiconductor light emitting device, the concave portions or convex portions are arranged in the shape of rectangular lattice such that one arrangement direction of the concave portions or the convex portions corresponds with the resonator direction and another arrangement direction is perpendicular to the resonator direction.

It is preferable that in the semiconductor light emitting device, the spacing between adjacent concave portions or convex portions in the one arrangement direction is different from the spacing between adjacent concave portions or convex portions in the another arrangement direction.

It is preferable that in the semiconductor light emitting device, the spacing between adjacent concave portions or convex portions in the one arrangement direction is larger than the spacing between adjacent concave portions or convex portions in the another arrangement direction.

It is preferable that in the semiconductor light emitting device, reflection films are provided on both end faces of the semiconductor layered structure.

It is preferable that in the semiconductor light emitting device, the semiconductor layered structure is provided with a photonic crystal structure on a periphery thereof, and the photonic crystal structure is comprised of a plurality of concave portions or convex portions arranged at a predetermined spacing.

It is preferable that in the semiconductor light emitting device, the concave portions or the convex portions are provided over an entire upper surface of the semiconductor layered structure.

It is preferable that in the semiconductor light emitting device, the region of the photonic crystal structure that does not overlap with the upper electrode as seen in a plan view is located at a center portion of the semiconductor layered structure.

It is preferable that in the semiconductor light emitting device, a spacing between part of the concave portions or convex portions adjacent in the resonator direction is larger than a spacing between another concave portions or convex portions by a wavelength/(actual refractive index×4).

It is preferable that the semiconductor light emitting device comprises a plurality of semiconductor layered structures arranged to cross one another.

According to the present invention, there is provided a method of fabricating a semiconductor light emitting device comprising: a semiconductor substrate; a semiconductor layered structure provided on the semiconductor substrate and comprised of a lower cladding layer, an active layer having a resonator in a direction parallel to the semiconductor substrate, and an upper cladding layer; an upper electrode connected to the upper cladding layer; and a lower electrode connected to the lower cladding layer, wherein light radiates in a direction substantially perpendicular to the semiconductor substrate, the method comprising the steps of epitaxially growing the semiconductor layered structure on the semiconductor substrate; etching the semiconductor layered structure to form a photonic crystal structure comprised of a plurality of concave portions arranged periodically in a resonator direction; and forming the upper electrode on the upper cladding layer so as to extend in stripe shape in the resonator direction such that the upper electrode does not overlap with at least part of the photonic crystal structure and the upper electrode and the photonic crystal structure are arranged in the resonator direction as seen in a plan view.

According to the present invention, there is further provided a method of fabricating a semiconductor light emitting device comprising: a semiconductor substrate; a semiconductor layered structure provided on the semiconductor substrate and comprised of a lower cladding layer, an active layer having a resonator in a direction parallel to the semiconductor substrate, and an upper cladding layer; an upper electrode connected to the upper cladding layer; and a lower electrode connected to the lower cladding layer, wherein light radiates in a direction substantially perpendicular to the semiconductor substrate, the method comprising the steps of epitaxially growing the semiconductor layered structure on the semiconductor substrate; selectively growing crystal on the upper cladding layer of the semiconductor layered structure to form a photonic crystal structure comprised of a plurality of concave portions arranged periodically in the resonator direction; and forming the upper electrode on the upper cladding layer so as to extend in stripe shape in the resonator direction such that the stripe-shaped upper electrode does not overlap with at least part of the photonic crystal structure and the upper electrode and the photonic crystal structure are arranged in the resonator direction as seen in a plan view.

The above and further objects and features of the invention will be more fully be apparent from the following detailed description with accompanying drawings.

BRIEF DESCRIPTION OF THE DRAWINGS

FIG. 5A is a cross-sectional view showing a structure of the semiconductor light emitting device and FIGS. 5B to 5D are plan views showing a structure of the semiconductor light emitting device;

FIGS. 7A and 7B are views for explaining a light emitting state of the semiconductor light emitting device according to the first embodiment of the present invention, in which FIG. 7A is a view showing the relationship between wave number and energy of light in a region without photonic crystal and FIG. 7B is a view showing the relationship between wave number and energy of light in a photonic crystal structure;

FIG. 9A is a cross-sectional view showing a structure of the semiconductor light emitting device and FIGS. 9B to 9D are plan views showing a structure of the semiconductor light emitting device;

FIGS. 10A and 10B are views for explaining a light emitting state according to the second embodiment of the present invention, in which FIG. 10A is a view showing the relationship between wave number and energy of light in a photonic crystal structure in a resonator direction, and FIG. 10B is a view showing the relationship between wave number and energy of light in the photonic crystal structure in a direction perpendicular to the resonator direction;

FIGS. 11A and 11B are views showing a structure of a semiconductor light emitting device according to a third embodiment of the present invention, in which FIG. 11A is a plan view and FIG. 11B is a view taken in the direction of arrows along line A—A in FIG. 11A;

FIGS. 12A and 12B are views showing a structure of modification of the semiconductor light emitting device according to the third embodiment of the present invention, in which FIG. 12A is a plan view showing a structure thereof and FIG. 12B is a view taken in the direction of arrows along line B—B in FIG. 12A;

FIGS. 13A and 13B are views showing a structure of a semiconductor light emitting device according to a fourth embodiment of the present invention, in which FIG. 13A is a plan view and FIG. 13B is a view taken in the direction of arrows along line C—C in FIG. 13A;

FIGS. 14A to 14E are views showing a modification of a semiconductor light emitting device according to a fourth embodiment of the present invention, in which FIGS. 14A to 14D are plan views showing a structure thereof and FIG. 14E is a view showing change in light intensity in an internal portion of a stripe structure of the semiconductor light emitting device;

FIGS. 15A to 15C are views showing a structure of a semiconductor light emitting device according to a fifth embodiment of the present invention, in which FIG. 15A is a plan view showing a structure thereof, FIG. 15B is a cross-sectional view showing a structure of modification, and FIG. 15C is a view showing change in light intensity in an internal portion of a stripe structure of the semiconductor light emitting device;

FIGS. 16A and 16B are views for explaining a light emitting state of the semiconductor light emitting device according to the fifth embodiment of the present invention, FIG. 16A is a view showing the relationship between wave number and energy of light in the photonic crystal structure in a α direction (resonator direction), and 16B is a view showing the relationship between wave number and energy of light in the photonic crystal structure in a β direction (direction perpendicular to the resonator direction);

FIGS. 17A to 17C are views for explaining a semiconductor light emitting device according to a sixth embodiment of the present invention, in which FIG. 17A is a plan view showing a structure of the semiconductor light emitting device, FIG. 17B is a view showing an operation principle of the semiconductor light emitting device, and FIG. 17C is a view showing behavior of an electric field;

FIGS. 18A and 18B are views showing a structure of a modification of the semiconductor light emitting device according to the sixth embodiment of the present invention, in which FIG. 18A is a plan view showing a structure of the modification and FIG. 18B is a plan view showing a structure of another modification;

FIGS. 19A to 19D are views for explaining a method of fabricating a semiconductor light emitting device according to a sixth embodiment of the present invention, in which FIG. 19A is a cross-sectional view showing a structure of the semiconductor light emitting device and FIGS. 19B to 19D are plan views showing a structure of the semiconductor light emitting device;

FIGS. 21A to 21D are views for explaining a method of fabricating a modification of the semiconductor light emitting device according to the sixth embodiment of the present invention, in which FIG. 21A is a cross-sectional view showing a structure of the modification, and FIGS. 21B to 21D are plan views showing a structure of the modification.

DETAILED DESCRIPTION OF THE PREFERRED EMBODIMENTS

Hereinafter, embodiments of the present invention will be described with reference to the accompanying drawings.

Figure 1:
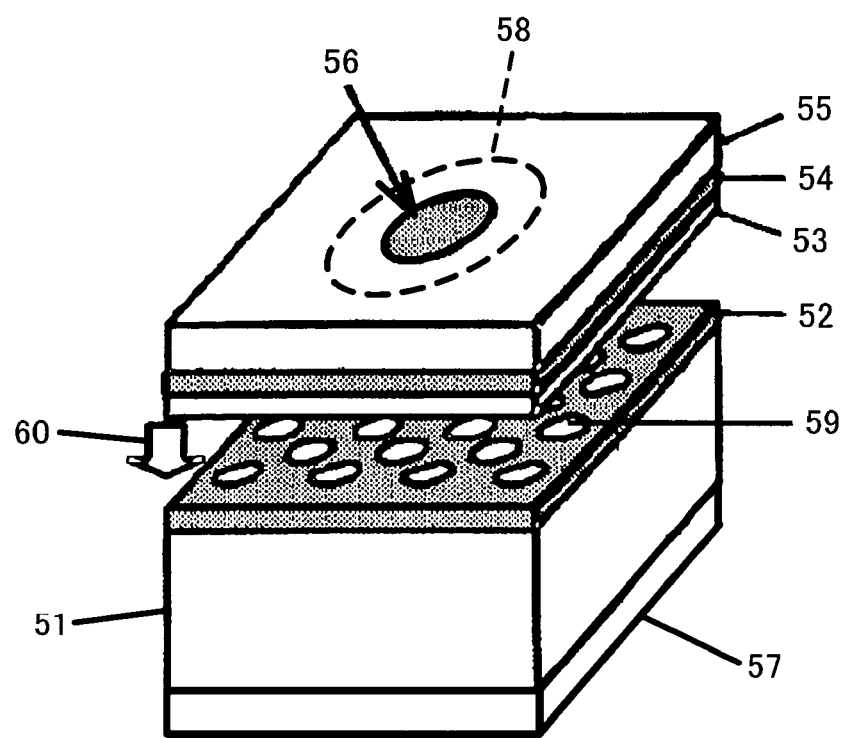
FIG. 1 is a perspective view showing a structure of the conventional semiconductor light emitting device using the conventional photonic crystal.
Figure 2:
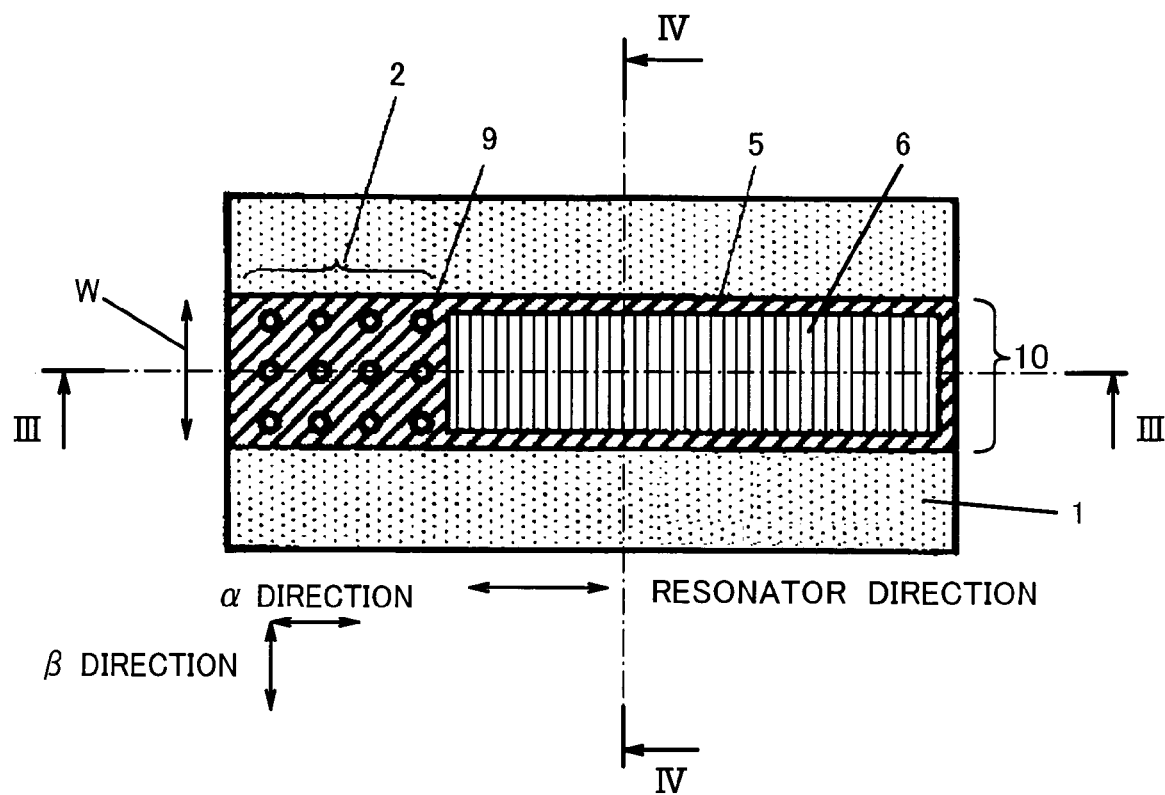
FIG. 2 is a plan view showing a structure of a semiconductor light emitting device according to a first embodiment of the present invention.
Figure 3:
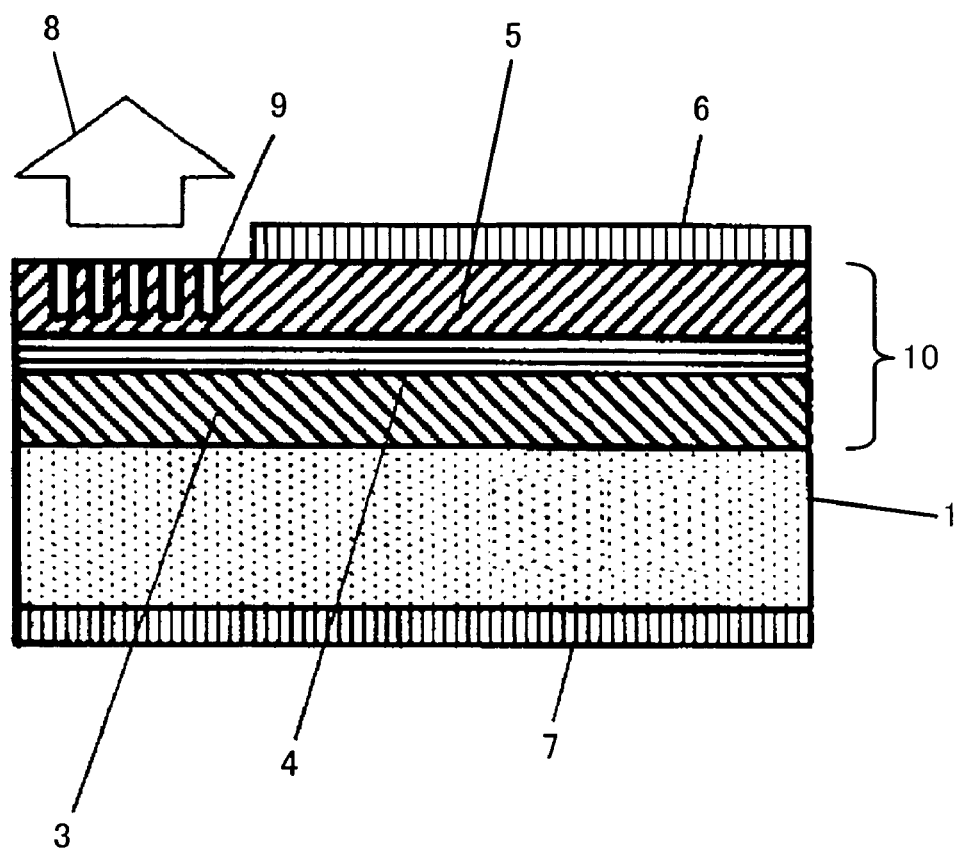
FIG. 3 is a view taken in the direction of arrows along line III—III in FIG. 2.
Figure 4:
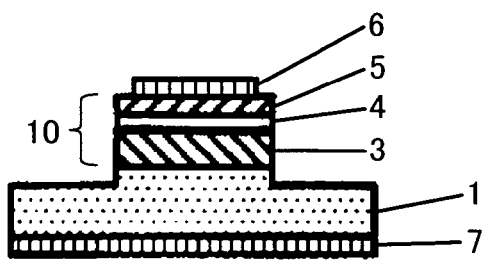
FIG. 4 is a view taken in the direction of arrows along like IV—IV in FIG. 2.

FIG. 2 is a plan view showing a structure of a semiconductor light emitting device according to a first embodiment of the present invention. FIG. 3 is a view taken in the direction of arrows along line III—III in FIG. 2. FIG. 4 is a view taken in the direction of arrows along line IV—IV in FIG. 2. In this embodiment, a light emitting wavelength of the semiconductor light emitting device is set to 1.3 $\mu$m.

As shown in FIGS. 2 to 4, a stripe structure 10 is provided on a n-type InP substrate 1. The stripe structure 10 has a n-type InP lower cladding layer 3 (100 nm thick), an InGaAsP/InGaAsP quantum well active layer 4 (hereinafter simply referred to as an active layer 4), and a p-type InP upper cladding layer 5 (50 nm thick), which are disposed in this order. The active layer 4 has a strained quantum well structure comprised of five pairs of $In_{0.9}Ga_{0.1}As_{0.2}P_{0.8}$ barrier layers (thickness: 10 nm, composition wavelength: 1.1 $\mu$m, lattice strain: 0%), $In_{0.9}Ga_{0.1}As_{0.5}P_{0.5}$ well layers (thickness: 4 nm, quantum well wavelength: 1.3 $\mu$m, lattice strain: 1%), and a wave guide (guide) layer. The stripe structure 10 has a cleaved end face, and as a result, the active layer 4 functions as a resonator in the direction parallel to the n-type InP substrate 1. The p-type InP upper cladding layer 5 is provided with a photonic crystal structure 2 obtained by arranging a plurality of cylindrical concave portions 9 in the shape of rectangular lattice. And, one of arrangement directions (α direction in FIG. 2) of two arrangement directions (α direction and β direction in FIG. 2) of adjacent concave portions 9 corresponds with the resonator direction.

As defined herein, the "resonator direction" refers to a direction expressed as the α direction in FIG. 2, i.e., longitudinal direction of a rectangular resonator.

A lower electrode 7 is provided on a rear surface of the n-type InP substrate 1. Meanwhile, a stripe-shaped upper electrode 6 is provided on a region of a surface of the p-type InP upper cladding layer 5 where the photonic crystal structure 2 is not provided as seen in a plan view. The stripe-shaped upper electrode 6 has a width smaller than that of the p-type InP upper cladding layer 5. The photonic crystal structure 2 and the upper electrode 6 are arranged in the resonator direction as seen in the plan view.

It should be noted that, when the active layer 4, i.e., the resonator has a width approximately as small as 2 $\mu$m, external differential quantum efficiency increases, but intensity of output light becomes saturated with an increase in an injected current. On the other hand, when the width W of the stripe structure 10 is increased to approximately 10 $\mu$m, light can be confined in the lateral direction (width direction of the resonator) within the photonic crystal structure 2, output saturation can be inhibited, but light mode in the region other than the photonic crystal structure 2 becomes unstable. Therefore, when a coupling factor of the photonic crystal structure 2 is relatively small, there is a limitation to an increase in the width W of the resonator. Under the circumstance, it is preferable that the width W of the resonator is in the range of approximately 2 $\mu$m to 10 $\mu$m.

Subsequently, a method of fabricating a semiconductor light emitting device of this embodiment configured as described above, will be described.

Figure 5A:
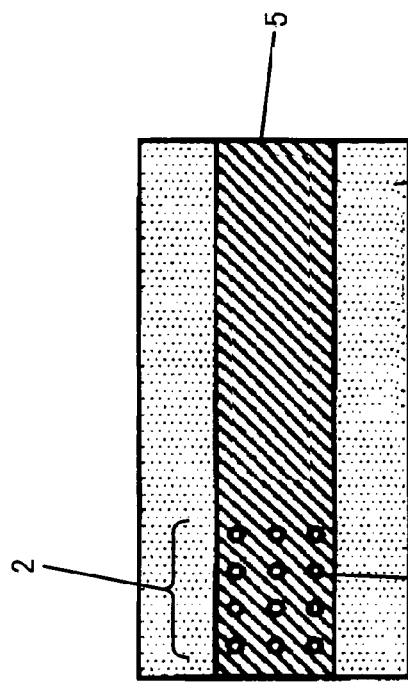
FIGS. 5A to 5D are views for explaining a method of fabricating the semiconductor light emitting device according to the first embodiment of the present invention.
Figure 5B:
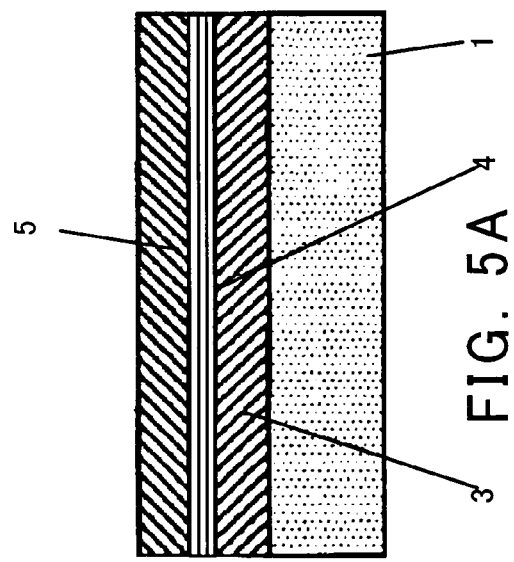
Figure 5C:
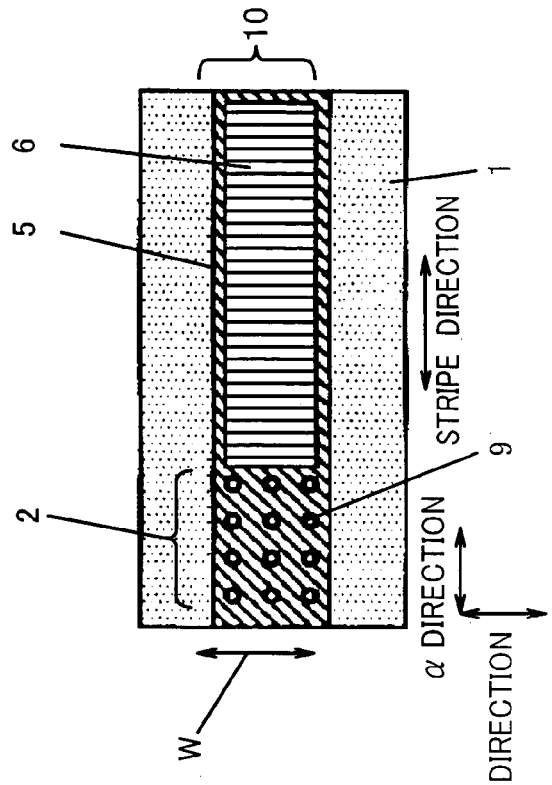
Figure 5D:
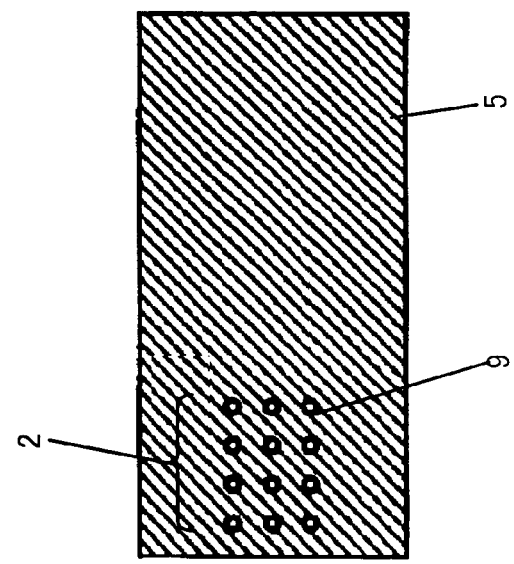

FIGS. 5A to 5D are views for explaining a method of fabricating the semiconductor light emitting device according to the first embodiment of the present invention, FIG. 5A is a cross-sectional view showing a structure of the semiconductor light emitting device, and FIGS. 5B to 5D are plan views showing a structure of the semiconductor light emitting device.

As shown in FIG. 5A, on the n-type InP substrate 1, the Si-doped n-type InP lower cladding layer 3 (100 nm thick), the undoped active layer 4 (14 nm thick), and the Zn-doped p-type InP upper cladding layer 5 (50 nm thick) are epitaxially grown by a known crystal growth method such as a MOVPE (metalorganic vapor phase epitaxy) process. The active layer 4 is intentionally undoped without addition of impurities, for the purpose of inhibiting absorption of valence band and absorption of free electrons.

Using a $SiO_2$ film as an etching mask, ICP dry etching is circularly performed using a $Cl_2$ gas and a $CH_4$ gas, thereby forming a plurality of cylindrical concave portions 9. In this case, as shown in FIG. 5B, the concave portions 9 are arranged in the shape of rectangular lattice. The region with the plurality of concave portions 9 arranged periodically becomes the photonic crystal structure 2. The period of the concave portions 9 (spacing between adjacent concave portions) is approximately equal to the wavelength of light. Therefore, in this embodiment, the period is approximately 1.3 $\mu$m.

As shown in FIG. 5C, in order to form a stripe structure, etching is performed until it reaches a part of the n-type InP substrate 1 from the p-type InP upper cladding layer 5 using an oxalic acid based etchant. Then, as shown in FIG. 5D, a stripe-shaped Cr/Pt/Au electrode as the upper electrode 6 is vapor deposited on the front surface of the p-type InP upper cladding layer 5 and the Au—Sn electrode as the lower electrode (not shown) is vapor deposited on the rear surface of the n-type InP substrate 1. In this case, the upper electrode 6 is formed on the front surface of the p-type InP upper cladding layer 5 by lift-off process so that the upper electrode 6 and the photonic crystal structure 2 are arranged in the resonator direction as seen in a plan view.

As described above, the plurality of concave portions 9 are arranged in the shape of rectangular lattice. As shown in FIG. 5D, the $\alpha$ direction of the arrangement directions of the concave portions 9 corresponds with the resonator direction.

Through the above steps, a semiconductor light emitting device of this embodiment can be fabricated.

When the concave portions 9 are formed as described above and the length of the photonic crystal structure 2 ($\alpha$ direction) is 2 $\mu$m or more, it is desirable that etching stop in the p-type InP upper cladding layer 5 so as to not etch the active layer 4, as shown in FIG. 3. By doing so, since damage to the active layer 4 can be inhibited, light emitting efficiency can be improved.

When the length of the photonic crystal structure 2 (in the $\alpha$ direction) is 10 $\mu$m or less, etching is preferably performed until it reaches the n-type InP lower cladding layer 3 such that the active layer 4 is etched through. When the length of the photonic crystal structure 2 is thus relatively small, for example, 10 $\mu$m or less, the effect produced by the photonic crystal is reduced. Accordingly, in order to facilitate coupling of light with photonic crystal, etching is performed until it reaches the n-type InP lower cladding layer 3 so that large part of light distribution is subjected to diffraction due to the photonic crystal. In this case, damage is caused by dry etching, but after the etching using the $Cl_2$ gas, the damaged region is etched using the $CH_4$ gas or the $SF_6$ gas. Thus, an increase in a threshold current is inhibited.

In this embodiment, the resonator direction is <110> or <–110> direction with high degree of cleavage. But, when the resonator is formed by dry etching, the resonator direction is not limited. Nonetheless, it is preferable that the resonator direction is <110> or <–110> direction in order to improve verticality of an etching end face. As used herein, the <–110> direction is <$^-$110> direction. In Specification and Claims, these mean the same.

The length of the resonator is set to approximately 20 $\mu$m to 50 $\mu$m. This is due to the fact that, since intensity of light diffracted within the photonic crystal structure 2 and taken out is small, light loss can be significantly reduced by reducing a light loss in the end face of the stripe structure 10 with coating on the end face as compared to a normal laser, and thereby sufficient light is emitted to outside regardless of reduced gain in a short resonator. It has been revealed that when the length of the resonator is 50 $\mu$m, the threshold current is approximately 20 $\mu$A, and when the length is 20 $\mu$m, there is no current value corresponding to the threshold, and light output is directly proportional to the injected current.

While in this embodiment, the cylindrical concave portions are periodically formed as the photonic crystal, cylindrical convex portions may be formed. The use of the cylindrical concave portions rather than the cylindrical convex portions can inhibit damage caused by etching because of a smaller volume of etching. In addition, the use of the convex portions presents a problem associated with intensity. In spite of this, the use of the cylindrical convex portions advantageously increases a period in arrangement in contrast with the concave portions, because an equivalent refractive index is low. Therefore, when the wavelength of light is as small as 0.85 $\mu$m, the convex portions are preferably used. In these respects, this embodiment is identical to another embodiment mentioned later.

The photonic crystal may be formed by periodically forming concave portions or convex portions that are tubular with rectangular cross-section, instead of forming the cylindrical concave or convex portions. But, as compared to the cylindrical concave or convex portions, the concave or convex portions that are tubular with rectangular cross-section, and have the same shape, are difficult to create. The same applies to cylindrical concave or convex portions with an oval cross-section. Variation in the shape increases with increasing ellipticity. In this embodiment, therefore, cylindrical shape with perfectly circular cross-section is adopted. In these respects, this embodiment is identical to another embodiments mentioned later.

An operation of the semiconductor light emitting device fabricated as described above will be described. Between the upper electrode 6 and the lower electrode 7, a voltage is applied under the condition in which the upper electrode 6 is at a positive potential and the lower electrode 7 is at a negative potential, thereby causing a current to flow through the active layer 4. As a result, electrons are injected from a n-type region to a p-type region in the active layer 4 and holes are injected from the p-type region to the n-type region. The injected electrons and holes causes stimulated emission in the vicinity of a p-n joint formed at an interface between the n-type region and the p-type region of the active layer 4. Thereby, light is generated in the active layer 4. This light is amplified within the active layer 4 and diffracted within the photonic crystal structure 2 in the direction perpendicular to the n-type InP substrate 1. As a result, light 8 is emitted from the photonic crystal structure 2 toward the direction perpendicular to the n-type InP substrate 1.

Figure 7B:
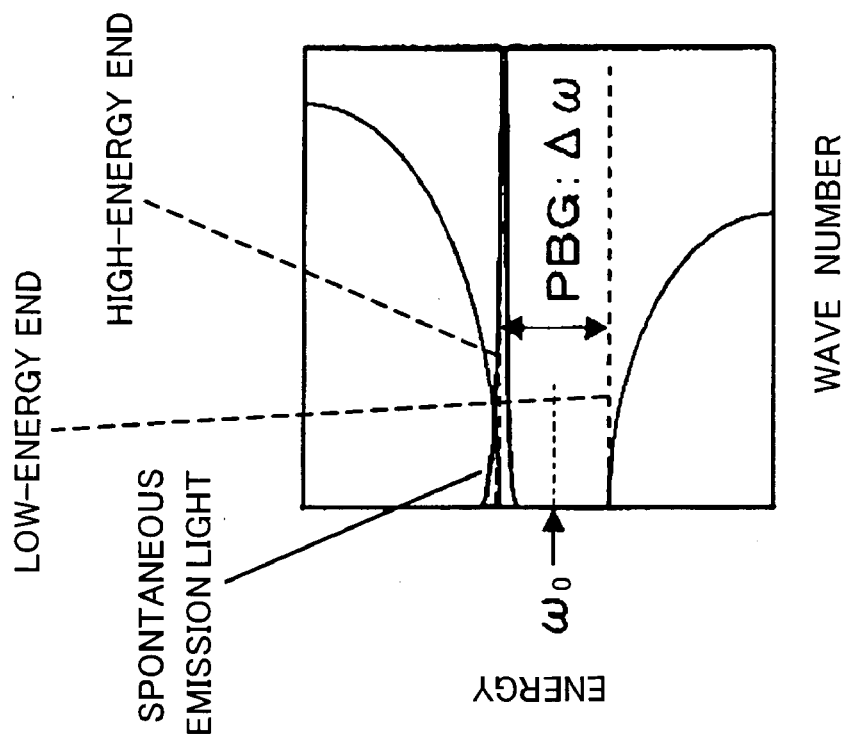
Figure 7A:
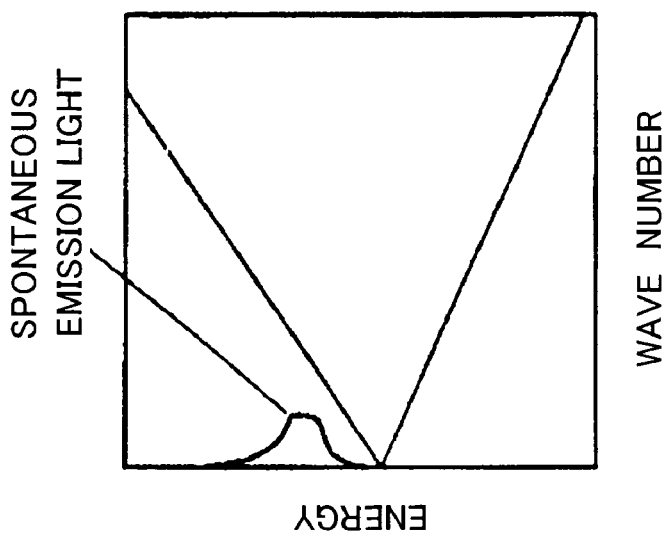

FIGS. 7A and 7B are views for explaining a light emitting state of the semiconductor light emitting device according to the first embodiment, in which FIG. 7A is a view showing the relationship between wave number and energy of light in the region without photonic crystal and FIG. 7B is a view showing the relationship between wave number and energy of light in the photonic crystal structure.

As shown in FIG. 7A, in the region where the photonic crystal is not formed, an energy linearly increases with increasing wave number. FIG. 7A shows the relationship between the energy and the wave number in a region with low light energy and the relationship after the light is turned back by the periodic structure. The energy increases with decreasing wave number. Thereafter, the light is turned back again and the energy increases with increasing wave number. Since perturbation due to the photonic crystal does not occur, the wave number and the energy continuously change and photonic band gap is not formed. When the light intensity is an abscissa axis and the wavelength is an ordinate axis in FIG. 7A, spontaneous emission light shows a Laurents distribution.

On the other hand, as shown in FIG. 7B, in the photonic crystal structure, since perturbation due to the photonic crystal occurs, photonic bandgap (PBG) is formed. Within the photonic bandgap, the spontaneous emission light cannot exist. On the other hand, the spontaneous emission light exists in a range of not less than a high-energy end of the photonic bandgap and not more than a low-energy end. An angular velocity $\omega_0$ of light corresponding to a center energy of the photonic bandgap is represented by:

$n_{eff} \omega_0/C = \pi/\Lambda$ when the period of the photonic crystal (spacing between adjacent concave portions 9) is $\Lambda$, where $n_{eff}$ is equivalent refractive index of light and c is a velocity of light.

The magnitude $\Delta\omega$ of the photonic bandgap is represented by:

$\Delta\omega = 2kc/n_{eff}$ where k is a coupling factor. When the high-energy end of the photonic bandgap conforms to the energy of the spontaneous emission light, a relationship associated with perturbation of the photonic crystal is added to the relationship between electrons that generate the spontaneous emission light and light, so that transition probability of the electrons and light are subjected to perturbation. As a result, as shown in FIG. 7B, the spontaneous emission light and the photonic bandgap are coupled, thereby obtaining a high intensity of the spontaneous emission light due to super radiation. A half width of the spontaneous emission light is 0.2 μm or less, and intensity of the light is approximately 30 times or higher.

While the high-energy end of the photonic bandgap conforms to the wavelength of the spontaneous emission light in FIG. 7B, the same results are obtained when the low-energy end of the photonic bandgap conforms to the wavelength of the spontaneous emission light. Nonetheless, in the case where a plurality of concave portions forming the photonic crystal are arranged in the rectangular lattice shape, it is advantageous that the high-energy end of the photonic bandgap conforms to the wavelength of the spontaneous emission light, since there is no influence of degeneration because of large band spacing.

In the case of the semiconductor light emitting device of this embodiment, there is no current value as a threshold, and output light increases according to an injected current. It has been revealed that the external differential quantization efficiency is approximately 60% when the wavelength is 1.3 μm. It has been found that an operational speed is 10 GHz when the injected current is 2 mA or more. Since coherent light having the same frequency and phase is obtained from a light emitting region, a spot can be restricted to a value corresponding to NA of a lens. Also, polarization planes of TE light are directed in the direction of the stripe structure (resonator direction). It has been found that when a relatively strong current is injected in the form of pulse, super radiation in which strong light is emitted for picosecond occurs.

While in this embodiment, the semiconductor substrate is comprised of InP crystal, GaAs, GaN or GaP crystal may be used if precision in forming the photonic crystal is increased. In addition, the semiconductor substrate may be of p-type instead of the n-type. Nonetheless, since the n-type crystal generally has a low resistance value, it is preferable that the crystal on the side where the photonic crystal is present between the crystal and the active layer, may be of n-type, because a current is uniformly injected into the active layer.

Figure 6:
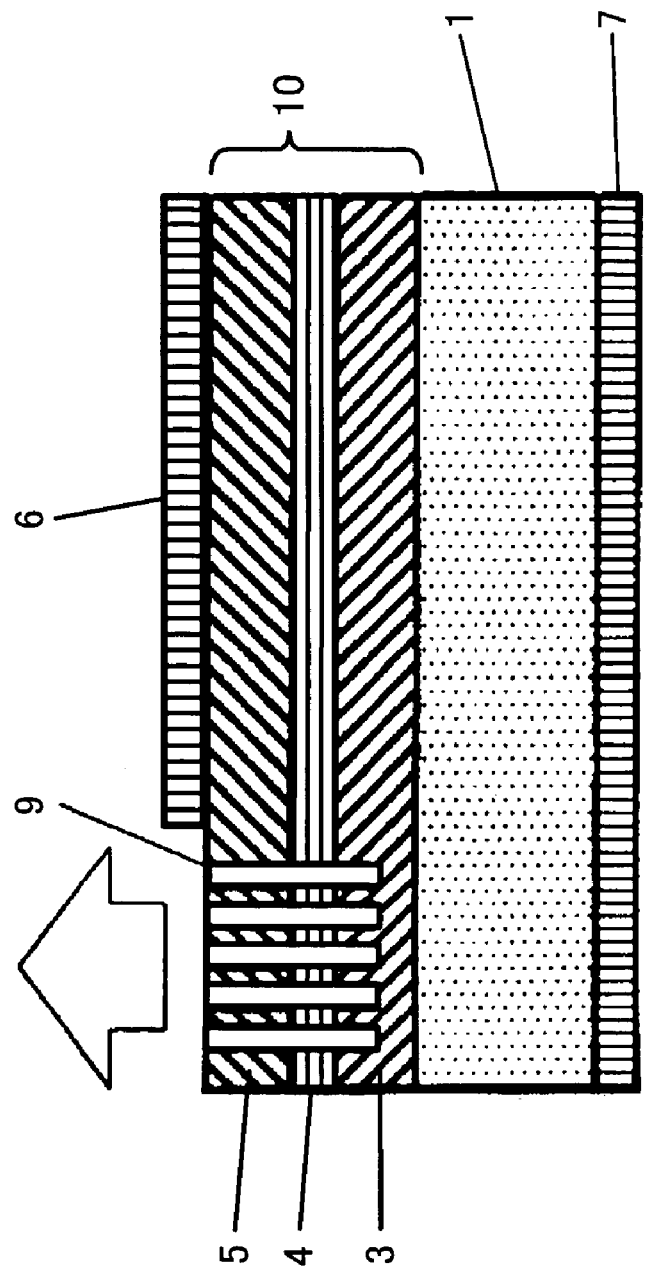
FIG. 6 is a cross-sectional view showing a structure of a modification of the semiconductor light emitting device according to the first embodiment of the present invention.

As described above, it is preferable that the length of the photonic crystal structure (α direction) in the structure shown in FIG. 3 (concave portions 9 are formed only within the p-type InP upper cladding layer 5) is 2 μm or more, and the length of the photonic crystal structure in FIG. 6 (concave portions 9 are formed to extend from the p-type InP upper cladding layer 5 to a part of the n-type InP lower cladding layer 3) is 10 μm or less. Therefore, the photonic crystal structure having the length (α direction) of not less than 2 μm and not more than 10 μm may adopt the structure in FIG. 3 or FIG. 6. Which of these is desirable depends on severity of damage caused by dry etching and degree of flatness of the shape of an etching surface. For instance, the structure in FIG. 6 can be obtained by forming a surface with high degree of flatness using a $Cl_2$ gas in dry etching and by removing a damage region using a $CF_4$ gas.

(Embodiment 2)

In a second embodiment, a description will be given of a semiconductor light emitting device configured to have photonic crystal as in the first embodiment and have a period of the photonic crystal in the resonator direction and a period of the photonic crystal in the direction perpendicular to the resonator direction which differ from each other.

Figure 8:
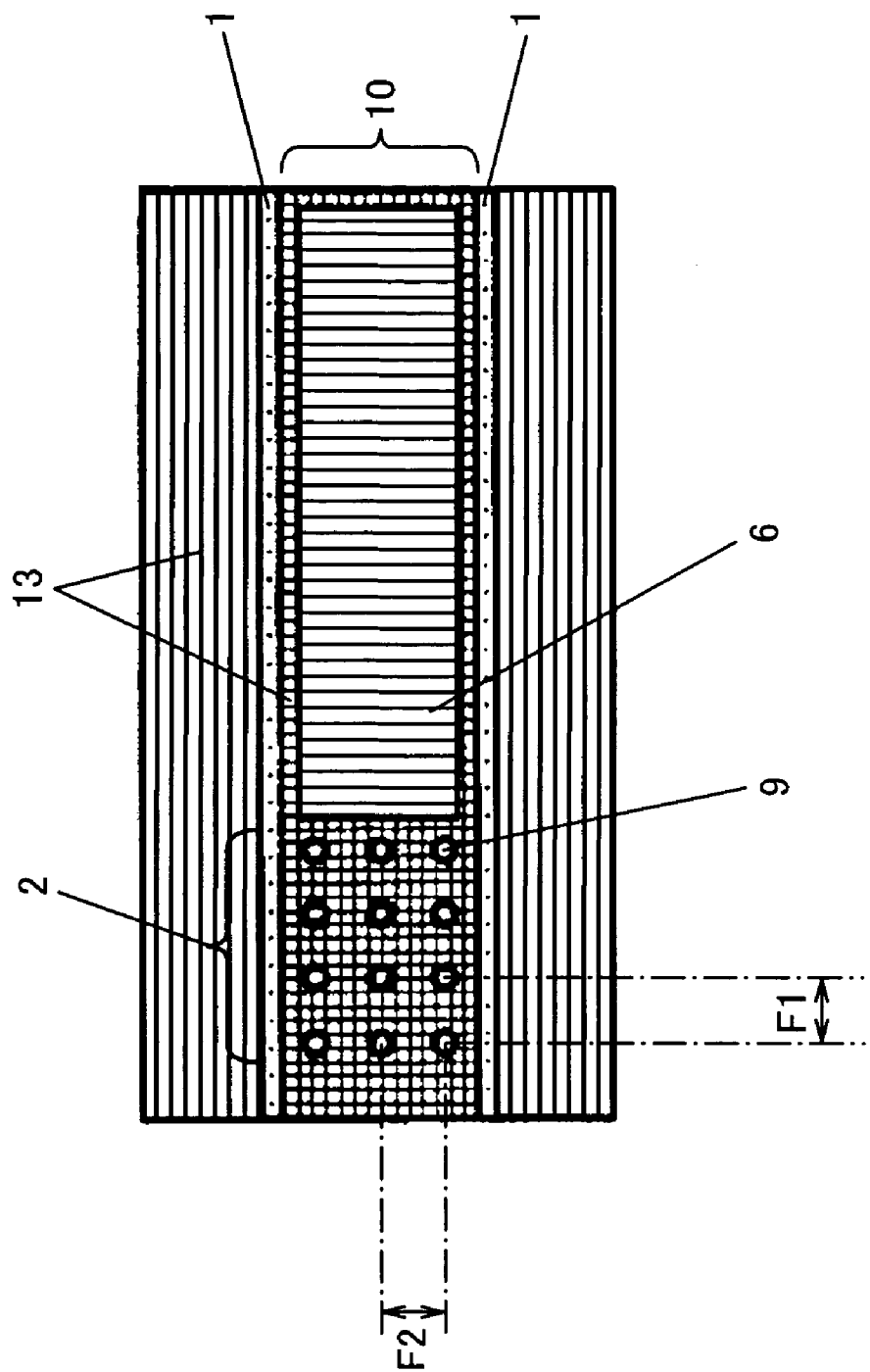
FIG. 8 is a plan view showing a structure of a semiconductor light emitting device according to a second embodiment of the present invention.

FIG. 8 is a plan view showing a structure of a semiconductor light emitting device according to the second embodiment of the present invention. As shown in FIG. 8, the photonic crystal structure 2 is formed by arranging a plurality of concave portions 9 in the shape of rectangular lattice. Here, a period of the concave portions 9 in the resonator direction (spacing between adjacent concave portions 9) F1 is longer than a period F2 of the concave portions 9 in the direction perpendicular to the resonator direction. In FIG. 8, reference numeral 13 denotes a growth region where the p-type InP upper cladding layer is selectively grown as described later. Since the other structure of the semiconductor light emitting device is identical to that of the first embodiment, they are identified by the same reference numerals and will not be described.

Subsequently, a fabrication method of the semiconductor light emitting device of this embodiment so structured, will be described. In the first embodiment, the fabrication method of the photonic crystal using the dry etching has been described, while in the second embodiment, the fabrication method of the photonic crystal using selective growth will be described. As a matter of course, as in the first embodiment, the photonic crystal can be formed by the method using dry etching. In all embodiments in the specification, the photonic crystal can be formed by a method using either the dry etching or a method using selective growth.

Figure 9A:
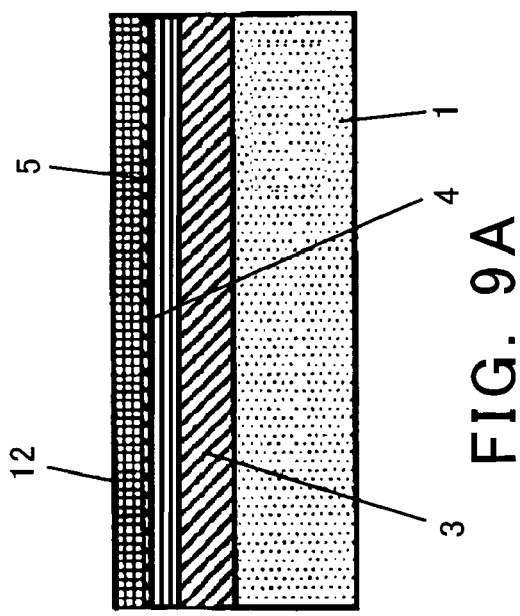
FIGS. 9A and 9B are views for explaining a method of fabricating the semiconductor light emitting device according to the second embodiment of the present invention.
Figure 9B:
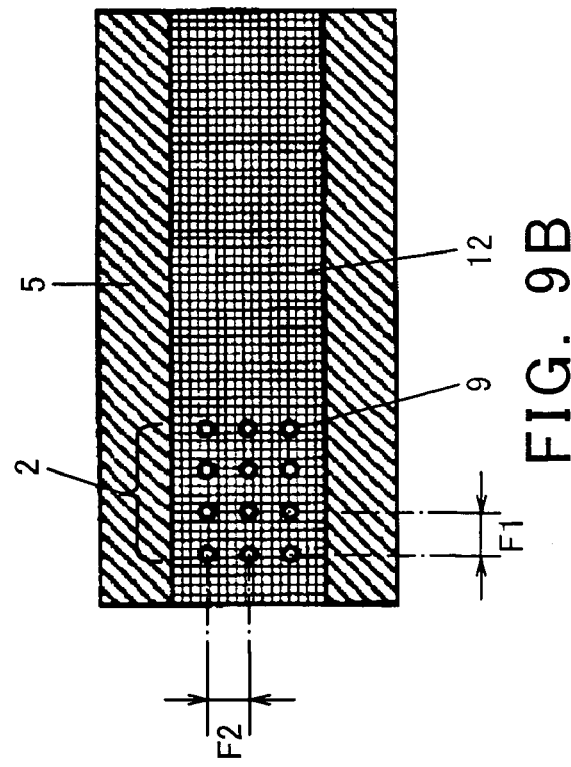
Figure 9C:
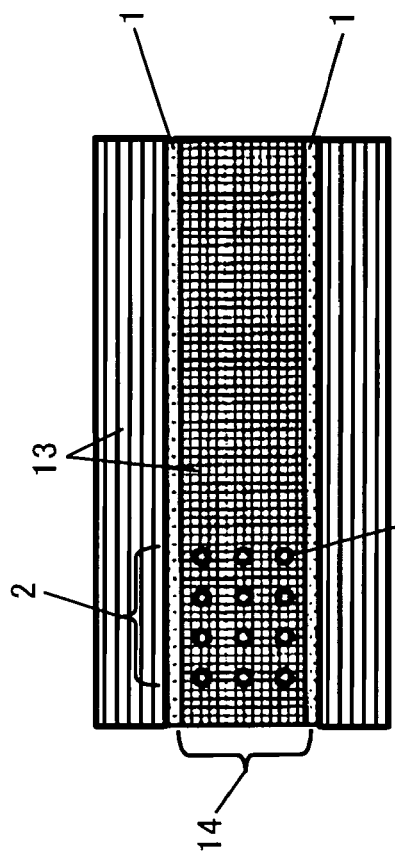
Figure 9D:
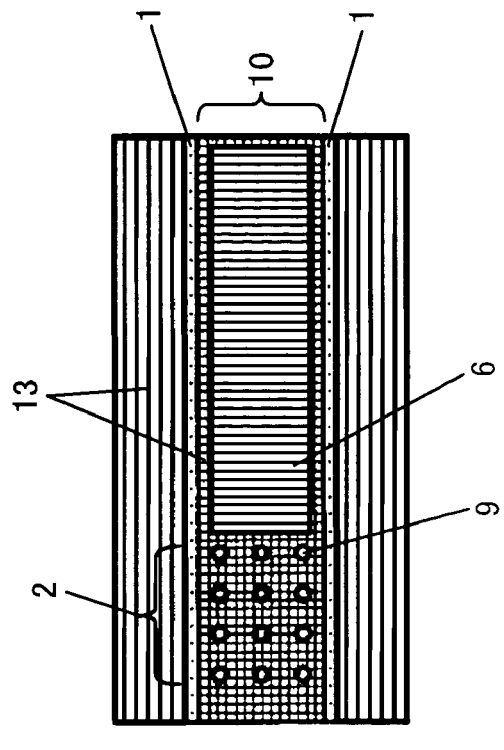

FIGS. 9A to 9D are views for explaining a method of fabricating the semiconductor light emitting device according to the second embodiment of the present invention, FIG. 9A is a cross-sectional view showing a structure of the semiconductor light emitting device and FIGS. 9B to 9D are plan views showing a structure of the semiconductor light emitting device.

As shown in FIG. 9A, on the n-type InP substrate 1, the Si-doped n-type InP lower cladding layer 3 (100 nm thick), the undoped active layer 4 (14 nm thick), and the Zn-doped p-type InP upper cladding layer 5 (10 nm thick) are epitaxially grown by a known crystal growth method such as the MOVPE process. A $SiO_2$ film 12 is formed on the p-type InP upper cladding layer 5.

Subsequently, as shown in FIG. 19B, using the $SiO_2$ film 12 as a selective growth mask, the p-type InP upper cladding layer 5 (100 nm thick) is selectively grown, thereby forming a plurality of cylindrical concave portions 9 arranged in the shape of rectangular lattice. Thus, the photonic crystal structure 2 is formed. At this time, the concave portions 9 are arranged so that the period F1 of the concave portions 9 in the direction coincident with the resonator direction is longer than the period 2F of the concave portions 9 in the direction perpendicular to the longitudinal direction thereof.

It should be appreciated that facets might be formed during selective growth when forming the photonic crystal structure 2 as described above. But, the facets are not formed when the film thickness is as small as approximately 200 μm or less.

Subsequently, as shown in FIG. 9C, in order to form a stripe structure, etching is performed until it reaches the part of the n-type InP substrate 1 using the oxalic acid based etchant. In FIG. 9, as described above, 13 denotes the growth region in which the p-type InP upper cladding layer is selectively grown. Then, as shown in FIG. 9D, the Cr/Pt/Au electrode as the upper electrode 6 is vapor deposited on the front surface of the p-type InP upper cladding layer 13 in the stripe structure 10. Also, the Au—Sn electrode as the lower electrode 7 (not shown) is vapor-deposited on the rear surface of the n-type InP substrate 1. In this case, the upper electrode 6 is formed on the front surface of the p-type InP upper cladding layer 5 by the lift-off process so that the upper electrode 6 and the photonic crystal structure 2 are arranged in the resonator direction as seen in a plan view.

Through the above steps, the semiconductor light emitting device of this embodiment will be described.

To obtain the structure with the concave portions 9 extending to the part of the n-type InP lower cladding layer 3 as shown in FIG. 6, the n-type InP lower cladding layer 3 is first epitaxially grown to have some thickness, and then using the $SiO_2$ film 12 as the selective growth mask, the n-type InP lower cladding layer 3, the active layer 4, and the p-type InP upper cladding layer 5 are selectively grown. In this case, in the vicinity of the selective growth mask, the film thicknesses of the layers become thin because of the presence of facets, thereby causing a reduced pressure resistance and thereby causing a leak current. Accordingly, preferably, a step of etching and removing the region having a small thickness is performed. Specifically, after the step of selective growth, the region having the small thickness is etched using the $CH_4$ gas or the $SF_6$ gas. Thereby, an increase in the threshold current can be inhibited.

While in this embodiment, the cylindrical concave portions 9 are provided, cylindrical convex portions may be provided. In the case of convex portions, cylindrical crystals are selectively grown individually. In this case, since the convex portions are individually grown, which tends to make the convex portions have different heights. This is problematic in terms of stability in selective growth. In addition, since the facets are formed in tip end portions of the convex portions under the condition in which the growth rate is relatively high, flatness is not obtained. In view of these, by carefully selecting the selective growth conditions, for example, by optimizing the growth condition such as reducing the growth temperature, the photonic crystal structure having the cylindrical convex portions should be created.

In the semiconductor light emitting device fabricated as described above, as in the first embodiment, upon application of the voltage between the upper electrode 6 and the lower electrode 7, stimulated emission occurs in the active layer 4. Thereby, light is generated in the active layer 4. This light is amplified within the active layer 4 and diffracted within the photonic crystal structure 2 in the direction perpendicular to the n-type InP substrate 1. As a result, light is emitted from the photonic crystal structure 2 toward the direction perpendicular to the n-type InP substrate 1.

Figures 10A, 10B:
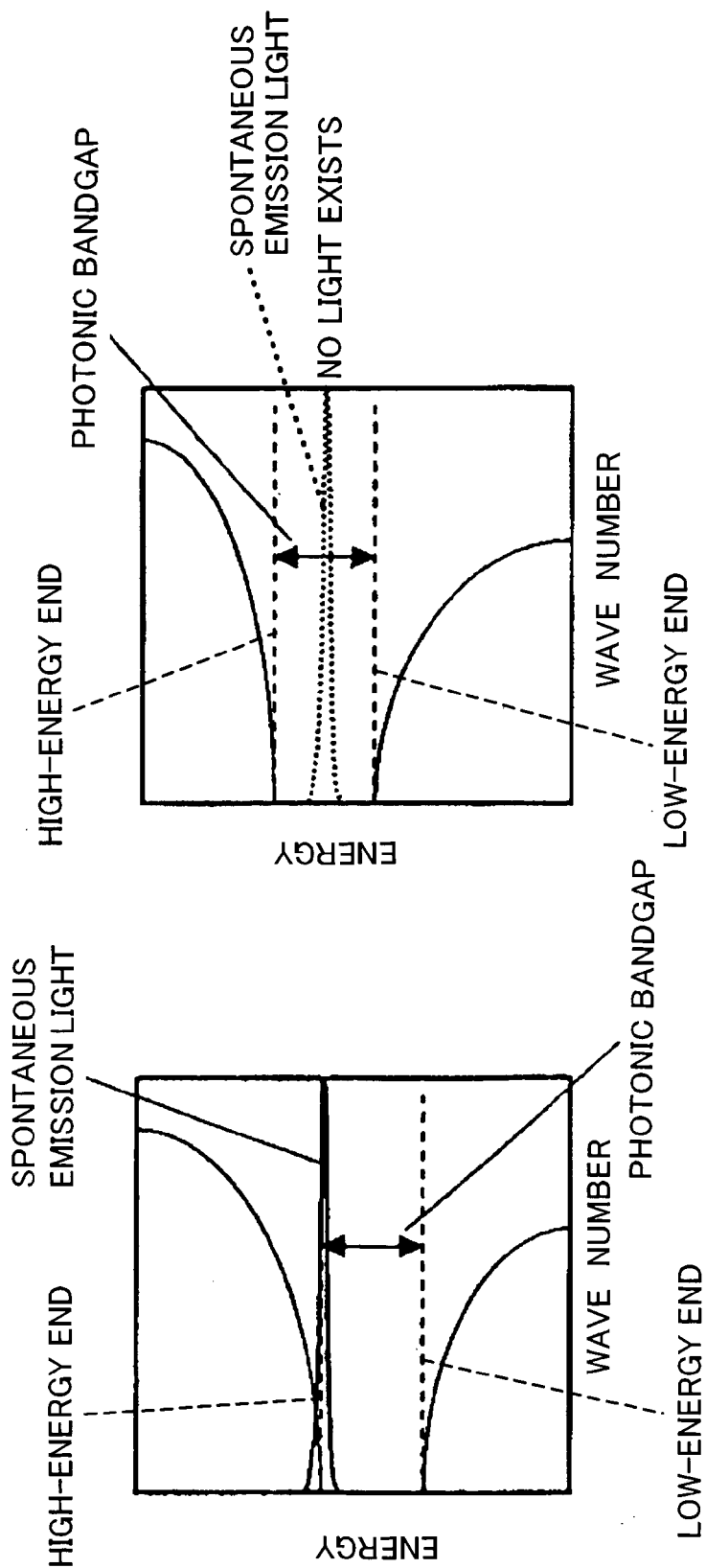

FIGS. 10A and 10B are views for explaining a light emitting state of the semiconductor light emitting device according to the second embodiment of the present invention, in which FIG. 10A is a view showing the relationship between wave number and energy of light in the photonic crystal structure in the resonator direction, and FIG. 10B is a view showing the relationship between wave number and energy of light in the photonic crystal structure in the direction perpendicular to the resonator direction.

In this embodiment, in the resonator direction, the period Λ of the photonic crystal is set such that the wavelength of the spontaneous emission light conforms to the high-energy end of the photonic bandgap. In the direction perpendicular to the resonator direction, the period Λ of the photonic crystal is set smaller than that in the direction coincident with the resonator direction. From $n_{eff} \cdot \omega/C = \pi/\Lambda$, the central energy (equivalent to ω) of the photonic bandgap increases as shown in FIGS. 10A and 10B.

As shown in FIGS. 10A and 10B, in the resonator direction, the spontaneous emission light is coupled to the band end, while in the direction perpendicular to the resonator direction, the wavelength of the spontaneous emission light is located within the photonic bandgap. Therefore, in the direction perpendicular to the resonator direction, the spontaneous emission light does not propagate. As a result, since light leakage from the stripe structure to outside is reduced, oscillation with a lower threshold current is achieved in contrast with the case where the period in the resonator direction is equal to the period in the direction perpendicular to the resonator direction.

In the semiconductor light emitting device of this embodiment, with the use of the cylindrical concave portions with perfectly circular cross-section, the polarization planes can be controlled. The first embodiment illustrates that the TE mode is formed in the resonator direction, but with an increase in the width of the stripe structure, stability of the mode is degraded. On the other hand, in this embodiment, by forming the photonic bandgap in the direction perpendicular to the resonator direction by varying the pitch of the photonic crystal, the TE mode does not exist in the direction perpendicular to the resonator direction. This follows that, with the stripe structure having a large width, the TE mode can be induced stably in the resonator direction.

In the selective growth, a rectangular structure can be created with good repeatability because the facets are formed during growth. Especially when the convex portions are selectively grown, it is possible to create convex portions having uniform shape by conducting facet growth. Therefore, when the convex portions are created by selective growth under optimized growth conditions, the photonic crystal structure comprised of convex portions that are tubular with rectangular cross-section are easily obtained.

(Embodiment 3)

In a third embodiment, there is illustrated a semiconductor light emitting device capable of avoiding leakage of spontaneous emission light and stimulated emission light in the resonator direction by forming reflection films on end faces of a stripe structure to reflect light.

FIGS. 11A and 11B are views showing a structure of the semiconductor light emitting device according to the third embodiment of the present invention, in which FIG. 11A is a plan view and FIG. 11B is a view taken in the direction of arrows along line A—A in FIG. 11A. As shown in FIGS. 11A and 11B, insulator multi-layered thin films 11 comprising alumina and titania are provided on both end faces of the stripe structure 10. Since the other structure of the semiconductor light emitting device of this embodiment is identical to that of the first embodiment, the same or corresponding parts are identified by the same reference numerals and will not be further described.

Subsequently, a method of fabricating the semiconductor light emitting device of this embodiment structured as described above will be described.

First of all, the photonic crystal structure 2 is created as in the first embodiment. Subsequently, the both end faces of the stripe structure are formed to be vertical by dry etching. Then, as shown in FIGS. 11A and 11B, the insulator multi-layered thin films 11 comprising alumina and titania are formed on the both end faces. Thereafter, the device is separated along the dry-etched grooves. In this embodiment, in order to deposit the insulator multi-layered thin films 11 on the vertical end faces of the stripe structure 10, high reflection multi-layered films are formed by an ECR sputtering process. When the number of layers forming the multi-layered thin film 11 is four, a refractive index of 98% is gained. By forming such a highly-reflective insulator multi-layered thin films 11, reflection loss at the end faces of the stripe structure 10 is significantly reduced. Thereby, as described in the first embodiment, the threshold current is set to approximately 20 $\mu$m in the short resonator having a length of approximately 50 $\mu$m.

However, when the insulator multi-layered thin films 11 are formed on the vertical faces, the film thicknesses of the insulator thin films become non-uniform when the layers are deposited, which leads to an increased reflection loss. Accordingly, the following structure is preferable.

FIGS. 12A and 12B are views showing a structure of a modification of the semiconductor light emitting device according to a third embodiment, in which FIG. 12A is a plan view showing a structure thereof and FIG. 12B is a view taken in the direction of arrows along line B—B in FIG. 12A. In this modification, a reflection mirror is formed by photonic crystal instead of the insulator multi-layered thin film.

As shown in FIGS. 12A and 12B, separation grooves 18 are formed in stripe in a plan view to extend from the p-type InP upper cladding layer 5 to the n-type InP substrate 1. The photonic crystal structure 2 and the upper electrode 6 are formed on the front surface of the p-type InP upper cladding layer 5 within a region 17 surrounded by the separation grooves 18. Cylindrical reflection concave portions 15 are formed in the shape of rectangular lattice in the p-type InP upper cladding layer 5 outside the region 17 so as to surround the region 17 surrounded by the separation grooves 18. In both of the α and β directions, a period of the reflection concave portions 15 (spacing between adjacent reflection concave portions 15) is shorter than a period of the concave portions 9. The reflection concave portions 15 are formed to extend from the upper cladding layer 5 to a part of the lower cladding layer 3. The region provided with the reflection concave portions 15 becomes a reflection mirror region. The region 17 is separated from the reflection mirror region by the separation grooves 18 for the purpose of inhibiting leakage of a current from the region 17 to the reflection mirror region.

When the reflection mirror is created by forming the insulator multi-layered thin films on end faces of the stripe structure, only the light in the direction coincident with the resonator direction is reflected. Therefore, such a reflection mirror is satisfactory for a laser. However, when the spontaneous emission light is controlled as in the present invention, the spontaneous emission light in the direction deviating slightly from the resonator direction cannot be reflected sufficiently. On the other hand, in this modification, a refractive index of 98% is gained by forming the reflection concave portions 15 in approximately four periods on one side in the reflection mirror region, while a refractive index of 95% is gained as shown in FIG. 12A, by forming the reflection concave portions 15 in approximately in two periods on one side. As a result, as described in the first embodiment, laser oscillation without a threshold current is achieved in a short resonator having a length of approximately 20 $\mu$m.

(Embodiment 4)

In a fourth embodiment, there is shown a semiconductor light emitting device capable of inhibiting a mode from becoming unstable due to fluctuation of a phase of light on a reflection plane by forming a photonic crystal structure over the entire stripe structure.

Figure 13A:
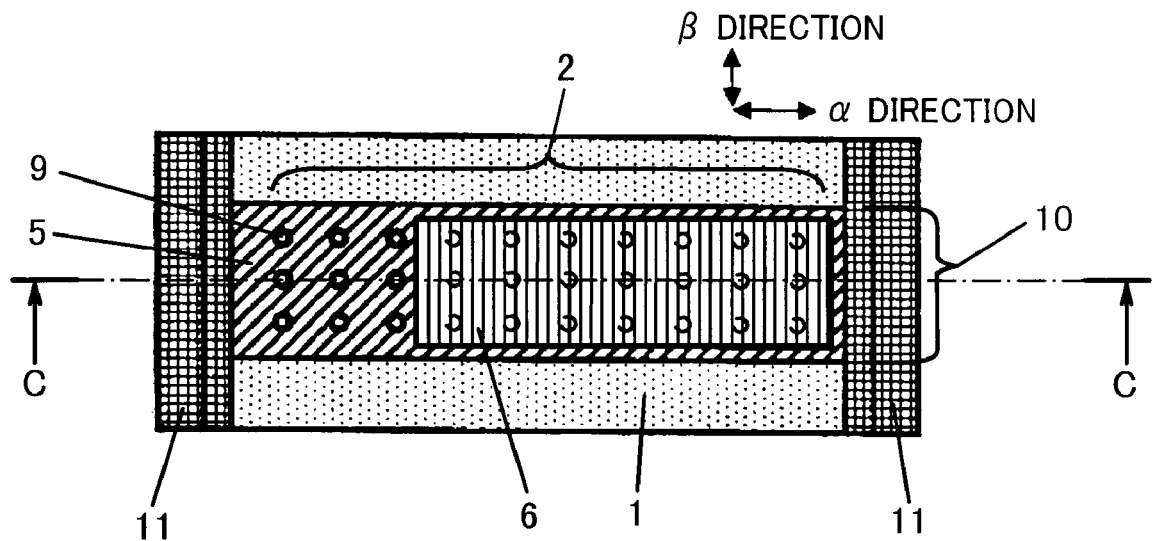
Figure 13B:
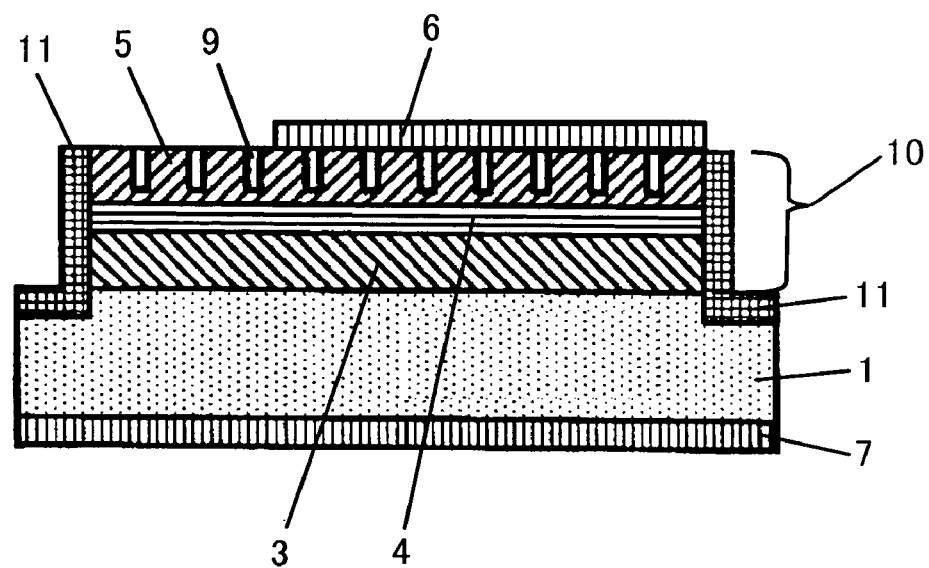

FIGS. 13A and 13B are views showing a structure of the semiconductor light emitting device according to the fourth embodiment of the present invention, in which FIG. 13A is a plan view and FIG. 13B is a view taken in the direction of arrows along line C—C in FIG. 13A.

As shown in FIGS. 13A and 13B, cylindrical concave portions 9 are formed in the shape of rectangular lattice over the entire p-type InP upper cladding layer 5 in stripe shape. Since the other structure of the semiconductor light emitting device of this embodiment is identical to that of the third embodiment, the same or corresponding parts are identified by the same reference numerals and will not be further described.

Subsequently, a method of fabricating the semiconductor light emitting device of this embodiment structured as described above will be described.

First of all, the photonic crystal structure 2 is created as in the first embodiment. At this time, the cylindrical concave portions 9 are formed over the entire upper surface of the stripe structure 10 by dry etching. Subsequently, the stripe-shaped upper electrode 6 is vapor deposited on the front surface of part of the photonic crystal structure 2. Then, to form the resonator, the both end faces of the stripe structure 10 are formed to be vertical by dry etching, and then the insulator multi-layered thin films 11 comprising alumina and amorphous silicon are formed on the both end faces. Thereafter, the device is separated along the dry-etched grooves, thereby obtaining the semiconductor light emitting device of this embodiment as shown in FIGS. 13A and 13B.

In the step of forming the upper electrode 6, to avoid entry of the electrode metal into an inside of the concave portion 9, instead of vapor deposition of all the electrode metal, a thin Cr/Pt is deposited on the photonic crystal structure 2 to cause a contact resistance to be reduced, and thereafter, a metal foil comprising Pt/Au is bonded thereto, thereby forming the upper electrode 6. By the way, as shown in FIG. 6, when the concave portions 9 are formed to extend to a part of the lower cladding layer 3, an increase in leak current due to entry of the electrode material is significant. Accordingly, in this case, it is preferable that after the thin $SiO_2$ film is deposited on the surface of the photonic crystal structure 2 and a surface of the flat portion of the $SiO_2$ film is removed by ICP dry etching using $CHF_3$, the upper electrode 6 is vapor deposited.

In the semiconductor light emitting device so fabricated, upon application of a voltage between the upper electrode 6 and the lower electrode 7, stimulated emission occurs in the active layer 4 as in the first embodiment. Thereby, light is generated in the active layer 4. This light is amplified within the active layer 4 and diffracted within the photonic crystal structure 2 toward the direction perpendicular to the n-type InP substrate 1. As a result, light is emitted from a region of the photonic crystal structure 2 which does not overlap with the upper electrode 6, toward the direction perpendicular to the n-type InP substrate 1.

As should be appreciated, when the semiconductor light emitting device is modulated at a high speed by providing the photonic crystal over the entire upper surface of the stripe structure 10, standing waves formed within the resonator become stable. This is because, when the modulation current is injected into the semiconductor light emitting device, the refractive index varies due to variation in carrier density within the resonator, and thereby, the standing waves become unstable in a region without the photonic crystal. In this embodiment, by providing the photonic crystal structure 2 over the entire upper surface of the stripe structure 10, perturbation of light is forcibly synchronized with the period of the photonic crystal. Thereby, it has been found that at the modulation speed of approximately 40 GHz, a stable light emitting mode is gained. However, when the resonator (active layer 4) has a length as large as 100 $\mu$m or more, light density within the resonator has a distribution in the resonator direction, so that an operation speed is limited. It is therefore preferable that the length of the resonator is set to 100 $\mu$m or less.

When stability of the mode is important than reduction of the threshold current, it is preferable that part of the cylindrical concave portion 9 are flat concave portions 16, as shown in FIG. 14A. In FIG. 14A, a plurality of flat concave portions 16 are formed on the region where the upper electrode 6 is provided. Herein, an evaluation index indicative of stability of the mode involves stability of a polarization plane. In two-dimensional photonic crystal in which the cylindrical concave portions 9 are arranged in the shape of rectangular lattice as shown in FIG. 13A, coupling of light in the β direction (direction perpendicular to the resonator direction) also occurs. For this reason, the polarization plane rotates due to variation in the light distribution in the β direction, so that the polarization plane becomes unstable. On the other hand, in the case of the photonic crystal structure provided with the flat concave portions 16, perturbation of the spontaneous emission light in the β direction does not occur, and coupling of only waves traveling in the a direction (resonator direction) occurs. For this reason, the spontaneous emission light is not sufficiently used and the threshold current increases. However, since light is subjected to perturbation with a uniform phase in the thickness direction of the stripe structure, the polarization plane does not rotate. As a result, the threshold becomes approximately 0.1 mA, but output light having a constant polarization plane is gained regardless of intensity of output light.

On the other hand, when stability of the mode is important than the light intensity, two upper electrodes 6 are provided at both end portions of the stripe structure 10 except the center portion as shown in FIGS. 14B and 14C. Thereby, the center portion of the stripe structure 10 becomes a light output region. As can be seen from FIG. 14E, in order to gain strong output light, it is desirable to take out light from a vicinity of the reflection plane where the light intensity within the resonator is high. However, in the vicinity of the end face, hole burning occurs because light intensity increases rapidly as it is closer to the end face, so that the polarization plane becomes unstable. Accordingly, as shown in FIGS. 14B and 14C, by providing the light emitting region at the center of the resonator (active layer 4), the region where the photonic crystal exists becomes a region having low light intensity, but the mode is stabilized because the hole burning does not occur.

Further, in order to improve stability of the polarization plane, as shown in FIG. 14D, flat concave portions 16 may be provided over the entire upper surface of the stripe structure 10. However, in such a structure, the polarization plane becomes constant, but the output light is not sufficiently coupled with the light within the resonator and the spontaneous emission light is not efficiently used. As a result, the out light is reduced.

While in this embodiment, the photonic crystal structure is comprised of cylindrical or flat concave portions, the photonic crystal structure may be comprised of cylindrical or flat convex portions. In this embodiment, the concave portions are used rather than the convex portions. This is because the concave portions reduces damage caused by dry etching, and when the electrode is formed on the photonic crystal, the crystal surface is continuous and flat, which makes it possible for the electrodes to be easily formed. Especially in this embodiment, the concave portions are preferably used. This is due to the fact that, if the photonic crystal structure is comprised of convex portions, then electrode metal is vapor deposited around the convex portions, and shortening might occur when etching is performed until it reaches the lower cladding layer or the active layer is selectively grown.

(Embodiment 5)

In a fifth embodiment, there is shown a semiconductor light emitting device capable of further stabilizing the light emitting mode by incorporating a phase shift structure into the photonic crystal structure.

Figure 15A:
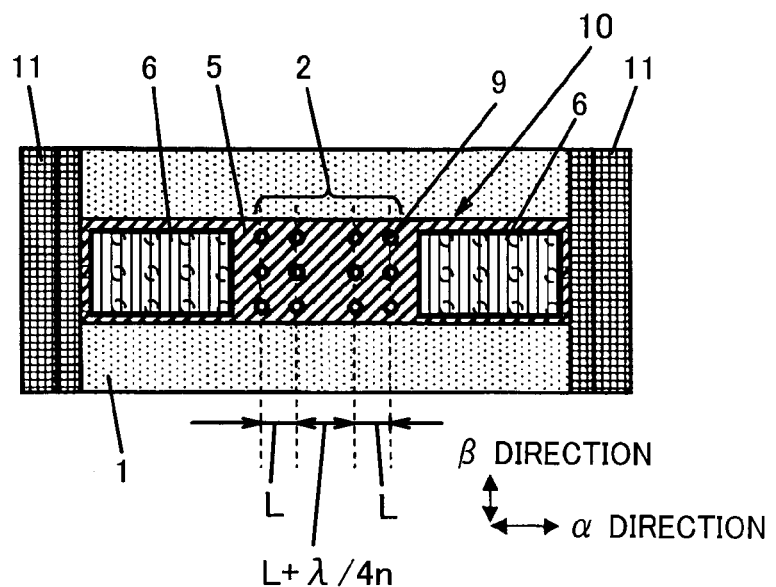
Figure 15B:
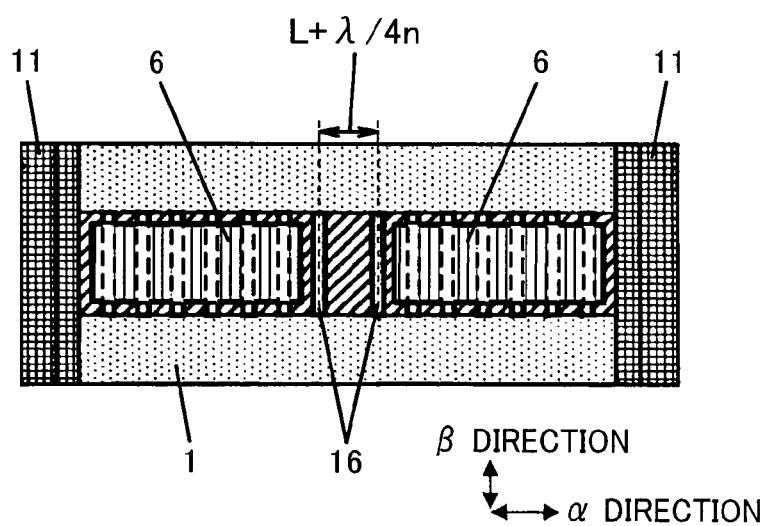
Figure 15C:
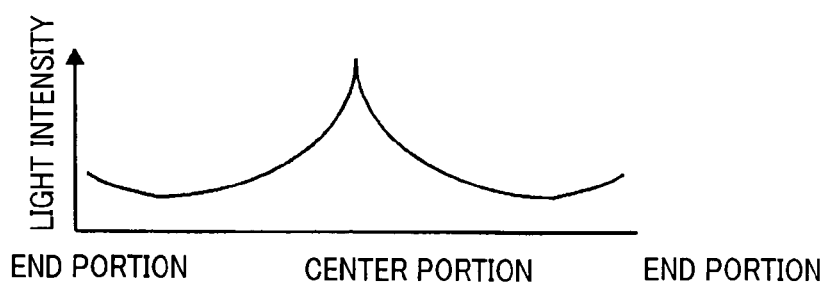

FIGS. 15A to 15C are views showing a structure of the semiconductor light emitting device according to the fifth embodiment of the present invention, in which FIG. 15A is a plan view showing the structure, FIG. 15B is a cross-sectional view showing the structure of a modification, and FIG. 15C is a view showing change in light intensity in an internal portion of a stripe structure of the semiconductor light emitting device.

As shown in FIG. 15A, the upper electrode 6 is formed on the upper surfaces of both end portions of the upper cladding layer 5, and is not formed on the center portion of the upper cladding layer 5. Therefore, in this embodiment, light emanates from the center portion of the stripe structure 10 (resonator).

Here, a spacing between adjacent concave portions 9 which are arranged in the resonator direction and located in a region other than the center portion of the resonator is represented by L. A spacing between adjacent concave portions 9 which are arranged in the resonator direction and located at the center portion of the resonator is increased to L+λ/4 n, where λ is a wavelength of light and n is an equivalent refractive index. Hereinafter, a structure with the spacing between concave portions increased by λ/4 n is called a λ/4 n shift structure.

Since the other structure of the semiconductor light emitting device of this embodiment is identical to that of the third embodiment, the same or corresponding parts are identified by the same reference numerals and will not be further described.

By incorporating the λ/4 n shift structure in the resonator direction, leftward wave and rightward wave are coupled, thereby causing light intensity in the center portion of the resonator to be increased as shown in FIG. 15C. As a result, since the light emanating region becomes symmetric, coupling to optical fibers is favorably facilitated. In addition, output light that is more intensive is gained by locating the light emanating region at the center portion of the resonator.

FIGS. 16A to 16B are views for explaining the light emitting state of the light emitting device according to the fifth embodiment of the present invention, FIG. 16A is a view showing the relationship between wave number and energy of light in the photonic crystal structure in the α direction (resonator direction) in FIGS. 15A, and 16B is a view showing the relationship between wave number and energy of light in the photonic crystal structure in the β direction (direction perpendicular to the resonator direction) in FIG. 15A.

As shown in FIG. 16A, the light energy obtained by coupling the leftward wave and the rightward wave to each other as described above is equivalent to the case where lattice defects occurs by incorporating the λ/4 n shift structure and a light energy level corresponding to defect level is formed within the photonic bandgap. When the λ/4 n shift structure is incorporated, energy corresponding to the lattice defect is derived from $n_{eff} \cdot \omega_0/C = \pi/\Lambda$. Therefore, this energy corresponds to an energy at the center of the photonic band gap energy. The energy of the photonic band gap is twice as high as $\Delta\omega = 2$ kc/$n_{eff}$ in the case where the concave portions 9 are arranged in the shape of rectangular lattice at equal intervals as shown in FIG. 14B in the fourth embodiment. When the concave portions 9 are thus arranged in the shape of rectangular lattice at equal intervals, there is a possibility that light is emitted at the high-energy end and the low-energy end as shown in FIG. 10A, but by incorporating the λ/4 n shift structure, light is emitted at the center portion of the photonic bandgap where light is most easily emitted. In the case of the λ/4 n shift structure, the high-energy side and the low-energy side of defect are located within the photonic bandgap. Therefore, light is subjected to perturbation more greatly as compared to the uniform lattice structure where the photonic bandgap is not provided on one side in a light-emitting state shown in FIG. 7B. Therefore, the spontaneous emission light with a large Q value, a small half width, and high intensity can be amplified in a specific mode.

In this embodiment, it has been revealed that, when the wavelength of the spontaneous emission light conforms to the defect level, it has been revealed that light emission due to strong perturbation is realized. By adjusting the period (spacing between adjacent concave portions) in the α and β directions, the spontaneous emission light level can be present within the photonic band gap in the lateral direction (direction perpendicular to the resonator direction). As a result, lateral light propagation becomes impossible and a single-mode light emission in the resonator direction is observed.

The photonic crystal structure 2 may be comprised of the cylindrical concave portions 9 as described above or may be comprised of the flat concave portions 16 as shown in FIG. 15B. The use of the flat concave portions increases a threshold current and intensity of output light, and improves stability of the polarization planes.

(Embodiment 6)

In a sixth embodiment, there is shown a semiconductor light emitting device capable of further stabilizing the light emitting mode by providing stripe structures having the photonic crystal structures so as to cross each other.

Figure 17A:
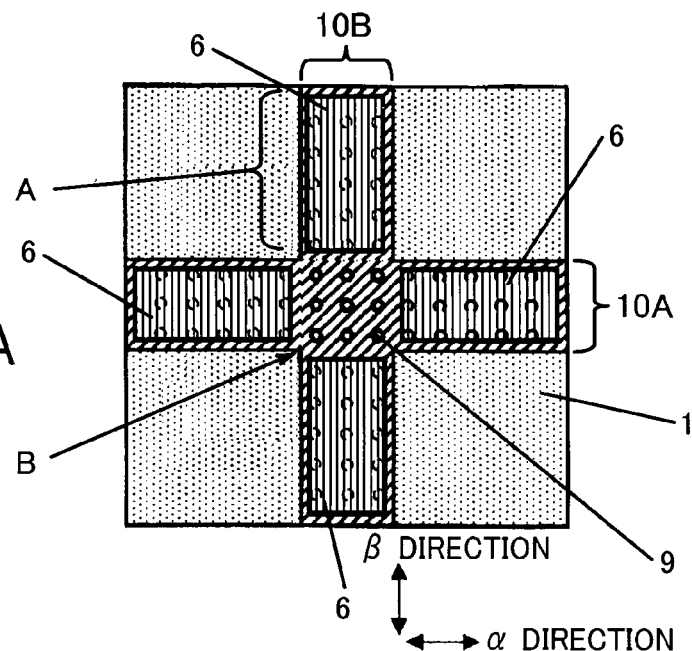
Figure 17B:
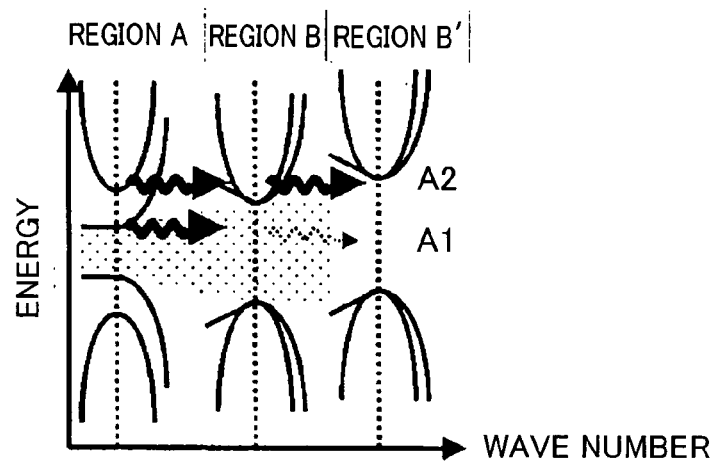
Figure 17C:
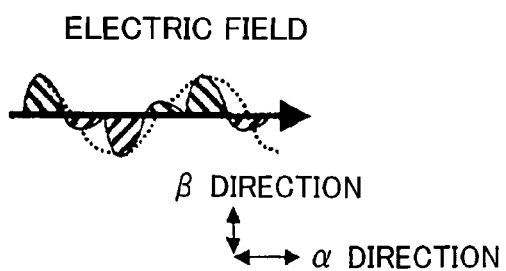

FIGS. 17A and 17B are views for explaining a semiconductor light emitting device according to a sixth embodiment of the present invention, in which FIG. 17A is a plan view showing a structure of the semiconductor light emitting device, FIG. 17B is a view showing an operation principle of the semiconductor light emitting device, and FIG. 17C is a view showing behavior of an electric field.

In this embodiment, two stripe structures similar to that of another embodiments, are provided so as to cross each other. More specifically, as shown in FIG. 17A, as in another embodiments, a stripe structure 10A and a stripe structure 10B, which have the photonic crystal structure, are arranged to extend respectively in the α direction and the β direction (direction perpendicular to the α direction) so as to cross each other. The upper electrode 6 is not provided on a region B where the stripe structure 10A and the stripe structure 10B cross each other, while the upper electrode 6 is provided on a region A other than the region B.

Since the other structure of the semiconductor light emitting device of this embodiment is identical to that of the first embodiment, the same or corresponding parts are identified by the same reference numerals and will not be further described.

Subsequently, a method of fabricating the semiconductor light emitting device of this embodiment will be described.

FIGS. 19A to 19D are views showing a method of fabricating the semiconductor light emitting device according to the sixth embodiment of the present invention, in which FIG. 19A is a cross-sectional view showing a structure of the semiconductor light emitting device, and FIGS. 19B to 19D are plan views showing a structure of the semiconductor light emitting device.

As described with reference to FIG. 5A in the first embodiment, on the n-type InP substrate 1, the Si-doped n-type InP lower cladding layer 3 (100 nm thick), the undoped active layer 4 (14 nm thick), and the zn-doped p-type InP upper cladding layer 5 (50 nm thick) are epitaxially grown by the known crystal growth method such as the MOVPE process (FIG. 19A).

Subsequently, as in the first embodiment, using the $SiO_2$ film as the etching mask, ICP dry etching is circularly performed using the $Cl_2$ gas and the $CH_4$ gas, thereby forming a plurality of cylindrical concave portions 9. In this case, as shown in FIG. 19B, the concave portions 9 are arranged in the shape of rectangular lattice so as to form a cross-shape. The region with the plurality of concave portions 9 arranged becomes the photonic crystal structure.

Subsequently, in order to form a stripe structure, etching is performed until it reaches a part of the n-type InP substrate 1 from the p-type InP upper cladding layer 5 using an oxalic acid based etchant (FIG. 19C). Then, as shown in FIG. 19D, the Cr/Pt/Au electrode as the upper electrode 6 is vapor deposited on the front surface of the p-type InP upper cladding layer 5 and the Au—Sn electrode as the lower electrode (not shown) is vapor deposited on the rear surface of the n-type InP substrate 1. In this case, the upper electrode 6 is formed on the surface of the p-type InP upper cladding layer 5 except the region where the stripe structures 10A and 10B cross each other by lift-off process. Thereby, the stripe structure 10A and the stripe structure 10B that crosses the stripe structure 10A are created.

Through the above steps, the semiconductor light emitting device of this embodiment is fabricated.

Subsequently, an operation principle of the semiconductor light emitting device of this embodiment will be described with reference to FIG. 17B. In FIG. 17B, an ordinate axis indicates energy and an abscissa axis indicates a wave number. In the region A other than the region B where the stripe structure 10A and the stripe structure 10B cross each other, since the mode is locally present in the resonator direction, degeneration is relieved, and the high energy end splits into two bands. On the other hand, in the region B where the stripe structure 10A and the stripe structure 10B cross each other, the α and β directions are symmetric, and degeneration at one energy level occurs. Here, when light in the region A is incident on the region B, light A1 on the low-energy side of the region A does not propagate because it is located within the bandgap of the region B, thereby resulting in a radiation mode. On the other hand, light A2 on the high energy side is amplified because it has passed through the region B. By causing the light A2 in the region A to conform to the energy of the high-energy end of the region B in a region B' obtained by adjusting a diffraction efficiency κ and a period Λ of the region B, only the light A2 in the region A is amplified and taken out. In this case, as shown in FIG. 17C, behavior of the electric fields are such that the polarization plane rotates at a frequency of light because variation in the electric field in the α direction and variation in the electric field in the β direction are perpendicular to each other. In normal observation, the electric fields are perpendicular to each other and the magnetic field and the electric field overlap with each other. As a result, the direction of the electric field conforms to the resonator direction, i.e., the direction of a period pointing vector of the photonic crystal structure. In the case of a normal photonic crystal device, the problem that the electric field deviates from the period pointing vector arises. In this embodiment, it has been found that there is an electric field perpendicular to the direction of the pointing vector.

The semiconductor light emitting device of this embodiment may have various structures described with reference to FIGS. 14A to 14D in the third embodiment.

Figure 18A:
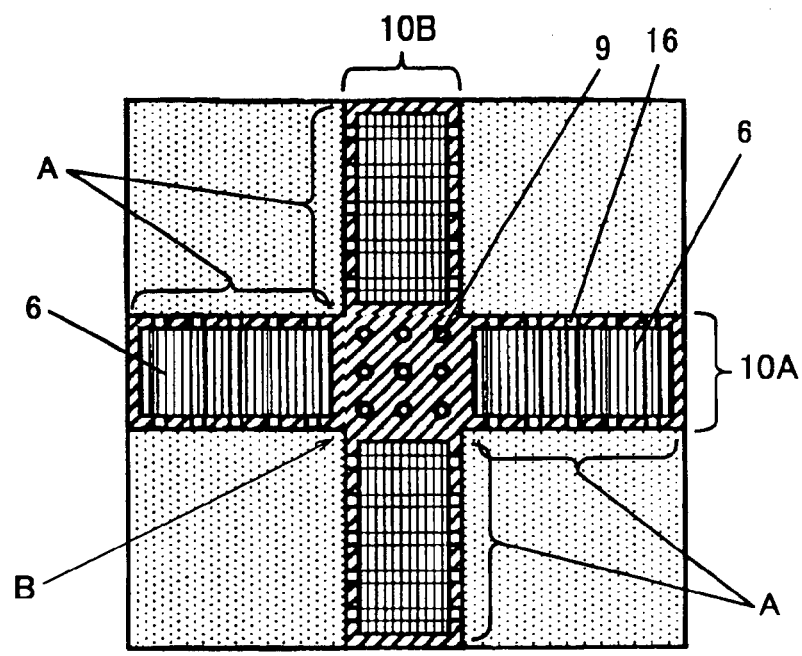
Figure 18B:
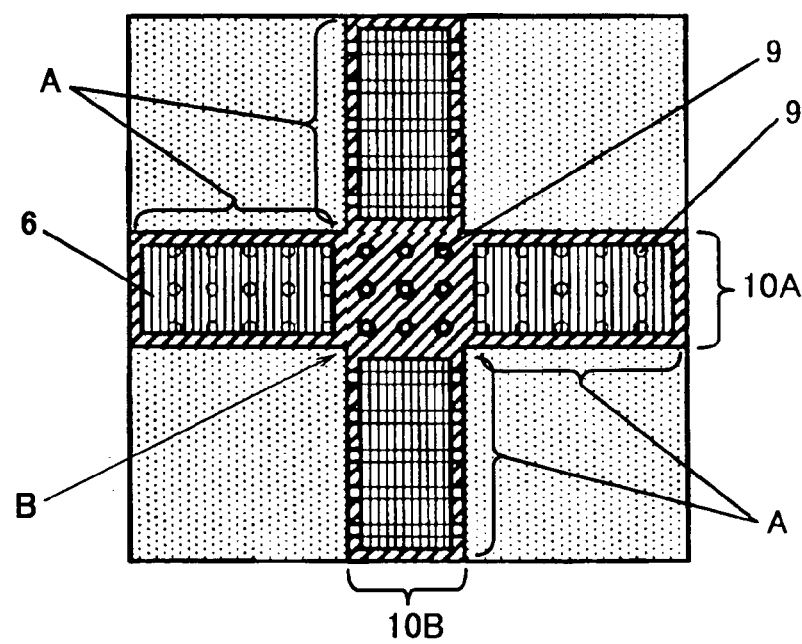

FIGS. 18A and 18B are views showing a structure of a modification of the semiconductor light emitting device according to the sixth embodiment of the present invention, in which FIG. 18A is a plan view showing a structure of the modification and FIG. 18B is a plan view showing a structure of another modification. In the modification shown in FIG. 18A, a photonic crystal structure in the region A of the stripe structures 10A and 10B is comprised of flat concave portions 16, while in the modification in FIG. 18B, a photonic crystal structure in the region A of the stripe structure 10A is comprised of cylindrical concave portions 9 and a photonic crystal structure in the region A of the stripe structure 10B is comprised of the flat concave portions 16. In this structure, emission of light from the region A (A1 in FIG. 17B) is inhibited.

FIGS. 20A to 20D are plan views showing a structure of another modification of the semiconductor light emitting device according to the sixth embodiment of the present invention. In the modification in FIG. 20A, in the region B as a light output region, square-lattice-shaped concave portions 19 are formed as seen in a plan view. In the modification in FIG. 20B, in the region B, concave portions 19 that are tubular with rectangular cross-section have a nested structure. It has been found that in these structures, rotation of the pointing vector is inhibited. In particular, in order to inhibit the spontaneous emission light from leaking out from the stripe structure forming the resonator structure, cylindrical concave portions are formed outside the stripe structure so as to have a period adjusted to allow the wavelength of light emission to be within the photonic bandgap. Thereby, light emission efficiency can be increased.

Figure 20A:
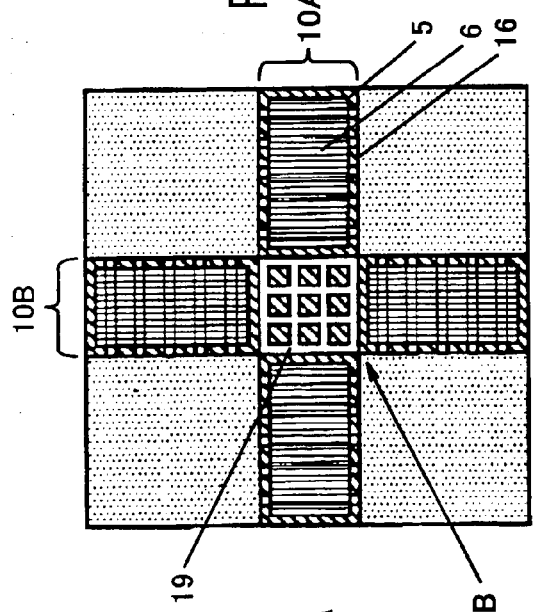
FIGS. 20A to 20D are plan views showing a structure of another modification of the semiconductor light emitting device according to the sixth embodiment of the present invention.
Figure 20B:
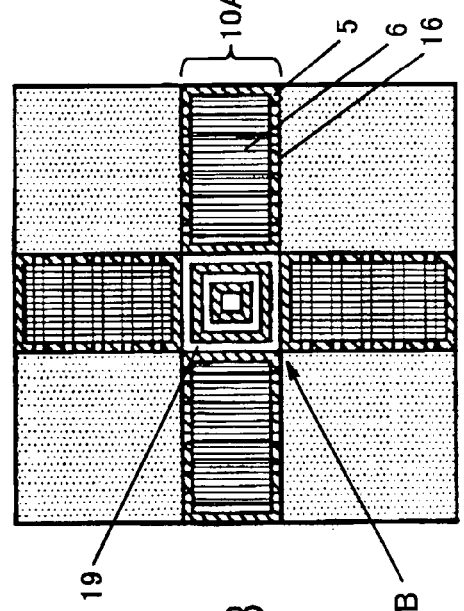
Figure 20C:
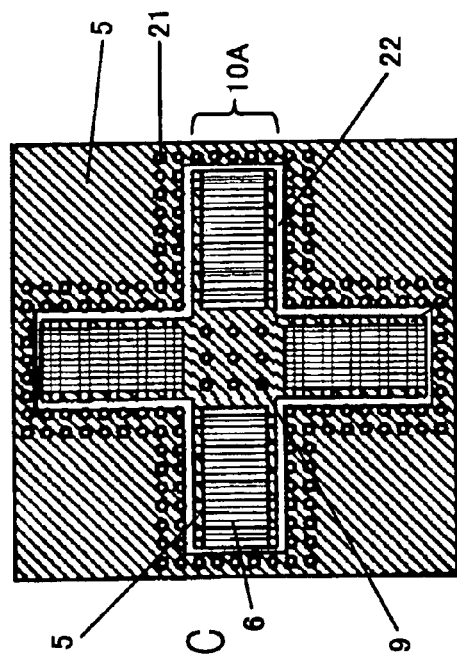

In the modification shown in FIG. 20C, a photonic crystal structure in which the wavelength of light emission is present within the photonic bandgap is formed around the resonator (stripe structure 10A and stripe structure 10B). In this case, advantageously, a high-reflection film need not be provided on the end faces of the resonator. FIG. 21 shows a method of fabricating such a modification.

FIGS. 21A to 21D are views for explaining a method of fabricating the modification of the semiconductor light emitting device according to the sixth embodiment, FIG. 21A is a cross-sectional view showing a structure of the modification, and FIGS. 21B to 21D are plan views showing the structure of the modification.

As described with reference to FIG. 5A in the first embodiment, on the n-type InP substrate 1, the Si-doped n-type InP lower cladding layer 3 (100 nm thick), the undoped active layer 4 (14 nm thick), and the zn-doped p-type InP upper cladding layer 5 (50 nm thick) are epitaxially grown by the known crystal growth method such as the MOVPE process (FIG. 21A).

Subsequently, the plurality of flat concave portions 16 and the cylindrical concave portions 9 are arranged to form a cross-shaped region. Specifically, as shown in FIG. 21B, the cylindrical concave portions 9 are arranged in the shape of rectangular lattice at a center portion of the cross-shaped region and the flat concave portions 16 are arranged at a predetermined spacing on the other region. And, around the cross-shaped region thus obtained, cylindrical reflection concave portions 21 are formed in the shape of rectangular lattice so as to surround the cross-shaped region.

As shown in FIG. 21C, separation grooves 22 are provided to surround the cross-shaped region comprised of the flat concave portions 16 and the cylindrical concave portions 9. As shown in FIG. 21D, an upper electrode is vapor deposited on a region other than the center portion of the cross-shaped region.

Through the above steps, the modification of the semiconductor light emitting device of the embodiment shown in FIG. 20C can be fabricated.

Figure 20D:
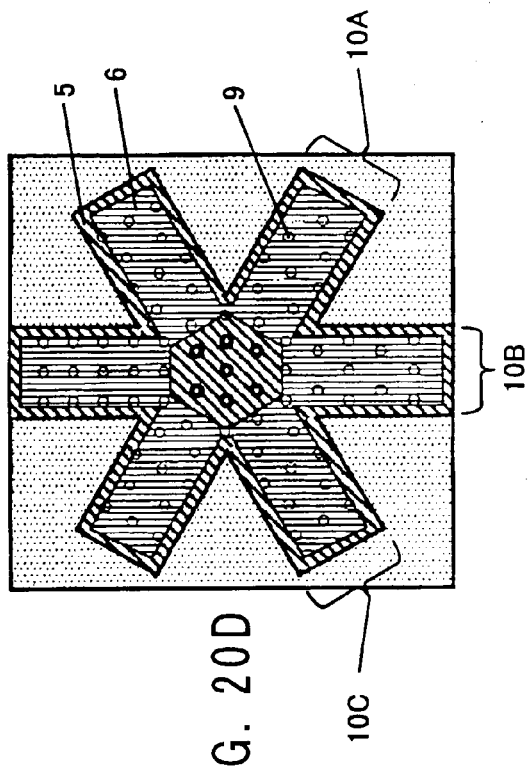

The photonic crystal in the embodiments and the modifications described above is formed by arranging the concave portions in the shape of square lattice or in the shape of rectangular lattice. Alternatively, as shown in FIG. 20D, the concave portions may be arranged in the shape of triangular lattice. In this case, three stripe structures 10A, 10B, and 10C are provided so as to cross one another at an angle of 60 degrees. Therefore, the region where the stripe structures 10A, 10B, and 10C cross one another is hexagon-shaped. In this case, because there are three resonator directions, triple degeneration occurs. For this reason, the photonic bandgap structure becomes complex, and design of the structure becomes difficult. Nonetheless, advantageously, since the spontaneous emission light from most of the light-emitting region can be utilized, a high-output light emitting device is achieved.

Numerous modifications and alternative embodiments of the invention will be apparent to those skilled in the art in the light of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. A semiconductor light emitting device comprising:
   a semiconductor substrate;
   a semiconductor layered structure provided on the semiconductor substrate and comprised of a lower cladding layer made of semiconductor of a first conductivity type, an active layer having a resonator in a direction parallel to the semiconductor substrate, and an upper cladding layer made of semiconductor of a second conductivity type;
   an upper electrode connected to the upper cladding layer and extending in a stripe shape in a resonator direction; and
   a lower electrode connected to the lower cladding layer, wherein
   the semiconductor layered structure has a photonic crystal structure on a front surface thereof in which a plurality of concave portions or convex portions are arranged periodically in the resonator direction,
   the photonic crystal structure is configured such that at least part of the photonic crystal structure does not overlap with the upper electrode and the photonic crystal structure and the upper electrode are arranged in the resonator direction as seen in a plan view,
   when a predetermined voltage is applied between the upper electrode and the lower electrode, a hole supplied from the lower electrode through the lower cladding layer and an electron supplied from the upper electrode through the upper cladding layer are re-coupled to each other within the active layer to thereby generate light in a region of the photonic crystal structure which does not overlap with the upper electrode as seen in the plan view and a region of the photonic crystal structure which overlays with the upper electrode as seen in the plan view, and
   the light radiates from the region of the photonic crystal structure which does not overlap with the upper electrode as seen in the plan view in a direction perpendicular to the resonator direction.

2. The semiconductor light emitting device according to claim 1, wherein the concave portions or the convex portions are formed in the upper cladding layer.

3. The semiconductor light emitting device according to claim 1, wherein the concave portions or the convex portions are formed in the upper cladding layer, the active layer, and the lower cladding layer.

4. The semiconductor light emitting device according to claim 1, wherein the concave portions or the convex portions are cylindrical.

5. The semiconductor light emitting device according to claim 1, wherein the concave portions or the convex portions are flat-plate shaped.

6. The semiconductor light emitting device according to claim 1, wherein the resonator has a width of not less than 2 $\mu$m and not more than 10 $\mu$m.

7. The semiconductor light emitting device according to claim 1, wherein the resonator has a length of not less than 20 $\mu$m and not more than 50 $\mu$m.

8. The semiconductor light emitting device according to claim 1, wherein the resonator direction is <110> direction or <-110> direction.

9. The semiconductor light emitting device according to claim 1, wherein the concave portions or convex portions are arranged in the shape of rectangular lattice such that one arrangement direction of the concave portions or the convex portions corresponds with the resonator direction and another arrangement direction is perpendicular to the resonator direction.

10. The semiconductor light emitting device according to claim 9, wherein a spacing between adjacent concave portions or convex portions in the one arrangement direction is different from a spacing between adjacent concave portions or convex portions in the another arrangement direction.

11. The semiconductor light emitting device according to claim 10, wherein the spacing between adjacent concave portions or convex portions in the one arrangement direction is larger than the spacing between adjacent concave portions or convex portions in the another arrangement direction.

12. The semiconductor light emitting device according to claim 1, wherein reflection films are provided on both end faces of the semiconductor layered structure.

13. The semiconductor light emitting device according to claim 1, wherein the semiconductor layered structure is provided with a photonic crystal structure on a periphery thereof, and the photonic crystal structure is comprised of a plurality of concave portions or convex portions arranged at a predetermined spacing.

14. The semiconductor light emitting device according to claim 1, wherein the concave portions or the convex portions are provided over an entire upper surface of the semiconductor layered structure.

15. The semiconductor light emitting device according to claim 14, wherein the region of the photonic crystal structure that does not overlap with the upper electrode as seen in a plan view is located at a center portion of the semiconductor layered structure.

16. The semiconductor light emitting device according to claim 1, wherein a spacing between part of the concave portions or convex portions adjacent in the resonator direction is larger than a spacing between another concave portions or convex portions by a wavelength/(actual refractive index×4).

17. The semiconductor light emitting device according to claim 1, comprising a plurality of semiconductor layered structures, wherein the plurality of semiconductor layered structures are arranged to cross one another.

18. A method of fabricating a semiconductor light emitting device comprising:
   a semiconductor substrate; a semiconductor layered structure provided on the semiconductor substrate and comprised of a lower cladding layer made of semiconductor of a first conductivity type, an active layer having a resonator in a direction parallel to the semiconductor substrate, and an upper cladding layer made of semiconductor of a second conductivity type; an upper electrode connected to the upper cladding layer and extending in a stripe shape in a resonator direction; and a lower electrode connected to the lower cladding layer, the semiconductor layered structure having a photonic crystal structure on a front surface thereof in which a plurality of concave portions or convex portions are arranged periodically in the resonator direction, the photonic crystal structure being configured such that at least part of the photonic crystal structure does not overlap with the upper electrode and the photonic crystal structure and the upper electrode are arranged in the resonator direction as seen in a plan view, wherein when a predetermined voltage is applied between the upper electrode and the lower electrode, a hole supplied from the lower electrode through the lower cladding layer and an electron supplied from the upper electrode through the upper cladding layer are re-coupled to each other within the active layer to thereby generate light in a region of the photonic crystal structure which does not overlap with the upper electrode as seen in the plan view and a region of the photonic crystal structure which overlaps with the upper electrode as seen in the plan view, and the light radiates from the region of the photonic crystal structure which does not overlay with the upper electrode as seen in the plan view in a direction perpendicular to the resonator direction, the method comprising the steps of:

epitaxially growing the semiconductor layered structure on the semiconductor substrate;

etching the semiconductor layered structure to form the photonic crystal structure comprised of the plurality of concave portions arranged periodically in the resonator direction; and forming the upper electrode on the upper cladding layer so as to extend in stripe shape in the resonator direction such that the upper electrode does not overlap with at least part of the photonic crystal structure and the upper electrode and the photonic crystal structure are arranged in the resonator direction as seen in the plan view.

19. A method of fabricating a semiconductor light emitting device comprising:

a semiconductor substrate; a semiconductor layered structure provided on the semiconductor substrate and comprised of a lower cladding layer made of semiconductor of a first conductivity type, an active layer having a resonator in a direction parallel to the semiconductor substrate, and an upper cladding layer made of semiconductor of a second conductivity type; an upper electrode connected to the upper cladding layer and extending in a stripe shape in a resonator direction; and a lower electrode connected to the lower cladding layer, the semiconductor layered structure having a photonic crystal structure on a front surface thereof in which a plurality of concave portions or convex portions are arranged periodically in the resonator direction, the photonic crystal structure being configured such that at least part of the photonic crystal structure does not overlap with the upper electrode and the photonic crystal structure and the upper electrode are arranged in the resonator direction as seen in a plan view, wherein when a predetermined voltage is applied between the upper electrode and the lower electrode, a hole supplied from the lower electrode through the lower cladding layer and an electron supplied from the upper electrode through the upper cladding layer are re-coupled to each other within the active layer to thereby generate light in a region of the photonic crystal structure which does not overlap with the upper electrode as seen in the plan view and a region of the photonic crystal structure which overlaps with the upper electrode as seen in the plan view, and the light radiates from the region of the photonic crystal structure which does not overlap with the upper electrode as seen in the plan view in a direction perpendicular to the resonator direction, the method comprising the steps of:

epitaxially growing the semiconductor layered structure on the semiconductor substrate;

selectively growing crystal on the upper cladding layer of the semiconductor layered structure to form the photonic crystal structure comprised of the plurality of concave portions arranged periodically in the resonator direction; and forming the upper electrode on the upper cladding layer so as to extend in stripe shape in the resonator direction such that the upper electrode does not overlap with at least part of the photonic crystal structure and the upper electrode and the photonic crystal structure are arranged in the resonator direction as seen in the plan view.

20. The semiconductor light emitting device according to claim 1, wherein a high energy end or a low energy end of a photonic band gap of the photonic crystal structure conforms to an energy of the light generated by re-coupling within the active layer.

21. The semiconductor light emitting device according to claim 20, wherein the high energy end of the photonic band gap of the photonic crystal structure conforms to the energy of the light generated by re-coupling within the active layer.

22. The semiconductor light emitting device according to claim 20, wherein the low energy end of the photonic band gap of the photonic crystal structure conforms to the energy of the light generated by re-coupling within the active layer.

23. The semiconductor light emitting device according to claim 20, wherein the light generated by re-coupling within the active layer is coupled to the photonic band gap, thereby causing the light to super-radiate in the direction perpendicular to the resonator direction.

* * * * *

UNITED STATES PATENT AND TRADEMARK OFFICE
CERTIFICATE OF CORRECTION

PATENT NO. : 7,009,216 B2  Page 1 of 1
APPLICATION NO. : 10/718581
DATED : March 7, 2006
INVENTOR(S) : Nobuyuki Otsuka et al.

It is certified that error appears in the above-identified patent and that said Letters Patent is hereby corrected as shown below:

Claim 1, Column 21, line 52, change "overlays" with -- overlaps --;
Claim 18, Column 23, line 23, change "overlay" with -- overlap --.

Signed and Sealed this

Twenty-first Day of November, 2006

JON W. DUDAS
*Director of the United States Patent and Trademark Office*